United States Patent [19]

Apotovsky et al.

[11] Patent Number: 5,677,539

[45] Date of Patent: Oct. 14, 1997

[54] SEMICONDUCTOR RADIATION DETECTOR WITH ENHANCED CHARGE COLLECTION

[75] Inventors: Boris Apotovsky; Clinton L. Lingren; Ashot Oganesyan, all of San Diego; Bo Pi, La Jolla; Jack F. Butler, Rancho Santa Fe; F. Patrick Doty, San Diego; Richard L. Conwell, Del Mar; Stanley J. Friesenhahn, Poway, all of Calif.

[73] Assignee: Digirad, San Diego, Calif.

[21] Appl. No.: 542,883

[22] Filed: Oct. 13, 1995

[51] Int. Cl.⁶ .................................................. G01T 1/24
[52] U.S. Cl. ............................. 250/370.13; 250/370.01
[58] Field of Search .......................... 250/370.13, 370.01

[56] References Cited

U.S. PATENT DOCUMENTS

| | | | |
|---|---|---|---|
| 3,761,711 | 9/1973 | Hall | 250/370 |
| 4,255,659 | 3/1981 | Kaufman et al. | 250/370.13 |
| 4,692,782 | 9/1987 | Seki et al. | 357/29 |
| 4,782,377 | 11/1988 | Mahan | 357/30 |
| 4,837,607 | 6/1989 | Kemmer et al. | 357/30 |
| 5,227,635 | 7/1993 | Iwanczyk | 250/370.12 |
| 5,391,882 | 2/1995 | Rhiger | 250/370.13 |

FOREIGN PATENT DOCUMENTS

| | | | |
|---|---|---|---|
| 62-293680 | 12/1987 | Japan . | |
| 1-138486 | 5/1989 | Japan . | |
| 2-105090 | 4/1990 | Japan | 250/370.01 |

OTHER PUBLICATIONS

Jalas, P., et al., "New Results in Semiconductor Drift Chambers for X-Ray Spectroscopy," IEEE Trans. Nucl. Sci., vol. 41, No. 4, Aug. 1994, p. 148.

Barrett, H.H., et al., "Charge Transport in Rays of Semiconductor Gamma-Ray Detectors," Physical Review Letters, Jul. 3, 1995, vol. 75, No. 1, 156–159.

Malm, et al., "Single Carrier Collection in Semiconductor Nuclear Detectors," Revue de Physique Appliquee, vol. 12, No. 2, Feb. 1977.

Luke, P.N., "Unipolar Charge Sensing with Coplanar Electrode—Application to Semiconductor Detectors," IEEE Trans. Nucl. Sci., vol. 42, No. 4, 1995, pp. 207–213.

Richter, M., et al., "High Resolution Gamma Ray Spectroscopy with CdTe Detector System," Nucl. Instruments and Methods in Physics Research A322, at 529–537 (1992).

Zanio, K., "Use of Various Device Geometry to Improve the Performance of CdTe Detectors," Revue de Physique Appliquee, No. 12, Feb. 1977.

Doty, F.P., et al., "Pixelated CdZnTe Detector Arrays," Nucl. Instruments and Methods in Physics Research A00 (1994).

Zanio, K., et al., "Performance of CdTe as a Gamma Spectrometer and Detector," IEEE Trans. Nucl. Sci., vol. 17 at 287–295 (1970).

Hecht, K., "Zum Mechanismus des lichtelektrischen Primarstromes in isolierenden Kristallen," Z. Physics, vol. 77 at 235 (1932).

(List continued on next page.)

*Primary Examiner*—Carolyn E. Fields.
*Attorney, Agent, or Firm*—Fish & Richardson, P.C.

[57] ABSTRACT

A radiation detector for detecting ionizing radiation. The detector includes a semiconductor having at least two sides. A bias electrode is formed on one side of the semiconductor. A signal electrode is formed on a side of the semiconductor and is used to detect the energy level of the ionizing radiation. A third electrode (the control electrode) is also formed on the semiconductor. The control electrode shares charges induced by the ionizing radiation with the signal electrode, until the charge clouds are close to the signal electrode. The control electrode also alters the electric field within the semiconductor, such that the field guides the charge clouds toward the signal electrode when the clouds closely approach the signal electrode. As a result, trapping of charge carrying radiation (i.e., electrons or holes) is minimized, and low-energy tailing is virtually eliminated.

102 Claims, 13 Drawing Sheets

OTHER PUBLICATIONS

Gatti, E., et al., "Semiconductor Drift Chamber—An Application of a Novel Charge Transport Scheme," Nucl. Instruments and Methods in Physics Research 225, at 608–614 (1984).

Ivanov, V.I., "Spectrometric Characteristic Improvement of CdTe Detectors," IEEE Trans. Nucl. Sci., vol. 42, No. 4, pp. 258–262 (Aug. 1995).

Malm, H.L., et al., "Gamma-Ray Spectroscopy with Single–Carrier Collection in High–Resistivity Semiconductor" Appl. Phys. Let., vol. 26, No. 6, at 344–346 (Mar. 1975).

SEMICONDUCTOR RADIATION DETECTOR WITH ENHANCED CHARGE COLLECTION

BACKGROUND OF THE INVENTION

1. Field of the Invention

This invention relates to a device and method for detecting ionizing radiation, and more particularly to a semiconductor radiation detector with enhanced charge collection for reducing low-energy tailing effects.

2. Description of Related Art

High-resistivity semiconductor radiation detectors are widely used for detecting ionizing radiation due to their ability to operate at room temperature, their small size and durability, and other features inherent in semiconductor devices. Such detectors are used in a wide variety of applications, including medical diagnostic imaging, nuclear waste monitoring, industrial process monitoring, and space astronomy. Ionizing radiation includes both particulate radiation, such as alpha or beta particles, and electromagnetic radiation, such as gamma or x rays.

Conventional semiconductor radiation detectors are generally referred to as "planar" detectors. As shown in FIG. 1A, the architecture of such planar detectors 100 typically consists of a slab of semiconductor crystal 102 with metal covering two opposing surfaces of the slab to form two electrodes, a cathode 104 and an anode 106. In one configuration, the anode 106 is connected to external signal conditioning circuitry 108 and to ground 110, and the cathode 104 is connected to an external voltage source 111. A bias voltage across the electrodes 104, 106 creates an internal electric field. Electron and hole clouds generated within the semiconductor crystal 102 by an ionizing radiation 112 absorbed within the slab of semiconductor drystat 102 are swept toward the anode 106 and cathode 104 electrodes, respectively. These moving electron and hole clouds create charge-pulse signals in the external circuit 111.

If all the electrons and holes generated by the ionizing radiation 112 reach their respective electrodes (i.e., the electrons reach the anode 106 and the holes reach the cathode 104), the output charge signal will exactly equal the charge from the energy deposited within the crystal 102. Because the deposited charge is directly proportional to the energy of the ionizing radiation 112, the semiconductor radiation detector 100 provides a means for measuring the energy of the ionizing radiation 112. The ability to measure this energy is an important function of radiation detectors.

Planar radiation detectors, however, suffer from a serious drawback: because of limitation in the transport properties of the bulk semiconductor crystal 102, some of the electrons and holes are generally lost by being trapped as they sweep toward their respective electrodes. Thus, the amplitude of the output charge signal becomes dependent on the position within the crystal at which the ionizing radiation is absorbed. Generally, the amplitude is less than the charge deposited by the ionizing radiation 112, resulting in a corresponding reduction of energy measurement accuracy as well as poor resolution and reduced peak efficiency. This loss (or trapping) of charge in a radiation detector results in asymmetrical spectral peak shapes known as "low-energy tailing."

As stated above, in a semiconductor radiation detector, when an ionizing event occurs, electrons are swept toward the anode 106 and holes toward the cathode 104. In a typical experimental arrangement, with the cathode 104 facing the source of the radiation, many ionization events occur over some accumulation period, and the resulting charge signal pulses are detected and then displayed in a histogram. In an ideal detector, in which there is no low-energy tailing, all the pulses would be directly proportional to the energy of the ionizing radiation 112. This would result in a histogram like that of FIG. 2, in which counts per channel are plotted versus charge signal pulse amplitude. As can be seen in FIG. 2, the energy histogram exhibits no tailing, because the energy peak (or "photopeak") 202 appears as a straight vertical line at a single energy level, E, equal to the energy level of the ionizing radiation 112. Thus, all the charge signal pulses have an amplitude equal to the energy level E of the ionizing radiation 112, and no charge is lost in any single pulse.

Curves A and B of FIG. 3 illustrate two hypothetical cases of low-energy tailing in a non-ideal detector. Curve A represents the histogram distribution that would result if the ionizing radiation were absorbed uniformly throughout the crystal, as would occur with a very low absorption coefficient of the crystal. Curve B represents the more typical situation, where absorption is large near the cathode and drops off exponentially as the ionizing event moves in a direction away from the cathode within the crystal. In both Curves A and B, there is a maximum signal 302 corresponding to full charge collection (at amplitude "E") and pronounced low-energy "tails" 304, 306.

FIG. 4 shows an energy histogram exhibiting pronounced low-energy tailing for an actual semiconductor radiation detector made from Cadmium-Zinc-Telluride (CdZnTe) irradiated with gamma rays from a cobalt-57 ("$^{57}$Co") radiation source. This detector had area dimensions of 6.1 mm by 6.1 mm and a thickness of 3 mm. Its bias voltage was −500 Volts. The entries in FIG. 4 are spread-out by electronic noise, an effect that was not considered in plotting the hypothetical curves of FIG. 3. As with Curves A and B of FIG. 3, the histogram of FIG. 4 has a pronounced low-energy tail 404.

Because of the deleterious effects of low-energy tailing in semiconductor detectors, much effort has gone into attempting to solve this problem. One approach to reducing the tailing effect in semiconductor detectors is to reduce the dependence of the signal pulse-charge amplitude on the position at which the ionizing radiation is absorbed. This can be accomplished, in principle, by contriving to limit to a small distance the region in which charge is induced on one electrode by a charge cloud in front of that electrode. If this is accomplished, a charge cloud generated by an ionizing event induces little charge on the electrode until it becomes very near the electrode, after which the charge cloud induces essentially all of its charge on that electrode. This approach is especially useful for semiconductors in which the transport properties of one carrier type (e.g., electrons) are much better than those of the other type (holes in this example). These transport properties are expressed by a "mobility-lifetime product." The ratio of the transport properties of one type carrier (e.g., holes) to those of the other type carrier (e.g., electrons) is expressed as the "mobility-lifetime-product ratio." Thus, the general approach described above is useful for all mobility-lifetime-product ratios, but is most useful for semiconductors having a large ratio of the larger mobility-lifetime product divided by the smaller. Semiconductors for which the mobility-lifetime-product ratio is greater than 10 include cadmium-zinc-telluride, cadmium-telluride, and mercury-iodide.

An early effort aimed at minimizing low-energy tailing using the above approach employed a semiconductor detector having a hemispherical configuration. See, e.g., H. L. Malm, et at., "Gamma-Ray Spectroscopy with Single- Carrier Collection in High Resistivity Semiconductors," Appl. Phys. Lett., vol. 26, at 344–46 (1975). In Malm's detector, a large hemispherical surface of the cadmium-telluride was metallized to form the cathode. The anode formed a small circle at the center of the flat cross-section of the hemisphere. A bias voltage applied across these electrodes produced an internal electric field that varied from a low value near the cathode to a high value near the small anode. The electric field lines were thus concentrated near the central point by the spherical geometry. A result of this electric field concentration is that the electrons move much faster in the close vicinity of the anode than in the remainder of the detector. Because the charge induced on the anode is inversely proportional to the square of the distance from the charge cloud to the anode, most of the charge is induced when the charge cloud is in the vicinity of the anode. The signal charge pulse amplitude is thus relatively insensitive to the position of the ionizing event in the detector.

The Malm approach, however, has several disadvantages. First, while energy resolution is improved over the planar detector, significant tailing remains. Second, it is difficult and thus costly to fabricate a semiconductor crystal having a hemispherical configuration. Third, the configuration cannot be applied to monolithic detector array structures. In consequence, this detector has achieved little, if any, commercial acceptance.

A second approach achieves a reduction in tailing by using a planar structure in which the anode is in two sections, a 0.5 mm diameter circle and a ring surrounding and at the same voltage as the circle, and the cathode covers the opposite surface. See, e.g., F. P. Doty, et al., "Pixilated CdZnTe Detector Arrays," Nucl. Instruments & Methods in Physics Research, vol. A 353, at 356–60 (1994). The charge induced by an electron cloud is shared between the small circle and the ring, such that the charge induced on the circle is very small until the charge comes very close to the circle. The full charge is then induced on the circle within a distance comparable to the pixel dimensions.

This second approach also suffers from a significant disadvantage, in that it results in a very low collection efficiency. This result stems from the fact that only charge clouds directly above the small anode are collected.

A third approach employs a structure in which the anode of a planar CdZnTe detector is segmented into an array of very small individual detectors (pixels), with the cathode remaining as a single, continuous electrode. See H. Barret, et al., "Charge Transport in Arrays of Semiconductor Gamma-Ray Detectors," Phys. Rev. Let. (In Press). Here, each pixel is connected to an external signal conditioning circuit. Charge induced by an electron cloud is shared among the pixels and is very small on any specific pixel until the charge is very near the pixel.

Yet this third approach also suffers from significant limitations. First, it is only useful for an array of very small pixels. Thus, this approach cannot be used for single-element detectors. Second, this approach is not applicable to detector arrays with pixel sizes of a millimeter or more, as used in nuclear medical imagers.

A fourth approach employs an anode patterned into an interleaving grid structure, with the cathode remaining planar. See, e.g., P. N. Luke, "Unipolar Charge Sensing with Coplanar Electrodes—Application to Semiconductor Detectors," IEEE Tran. Nucl. Science, vol. 42, No. 4, at 207–213 (1995). In the Luke approach, one set of anode grids is maintained at a slightly higher voltage than the other. A train of signal conditioning electronics is connected to each set of grids, and the difference between the outputs from these trains constitutes the final output signal. With this arrangement, when the charge cloud is far from the grids, the difference-signal between the grid outputs is zero. As the cloud approaches the grids, the induced charge on one grid rises rapidly, while the charge induced in the other grid drops rapidly. The difference signal is then a measure of the full charge in the electron cloud, independent of the position of the ionizing event.

The Luke approach, however, also suffers from drawbacks. First, the grid structure is relatively complex and would be difficult, if not impossible, to use in detector arrays. Second, the grids require two separate amplifying chains, plus a difference amplifier, which add significantly to the complexity and cost of manufacture. This circuitry would also be very difficult to implement in multi-channel integrated circuits needed in detector array structures.

A final approach to reducing low-energy tailing may be implicit in the design of silicon drift chambers. See, e.g., E. Gatti & P. Rehak, "Semiconductor Drift Chamber—An Application of a Novel Charge Transport Scheme," Nucl. Inst. & Methods in Physics Research, vol. 225, at 608–614 (1984). A semiconductor drift chamber is based on the principle that a thin, large area semiconductor wafer, with rectifying junctions implanted on both surfaces, can be fully depleted through a small anode contact. The depletion field confines electrons generated by an ionizing particle in a buried potential channel parallel to the surface. An electrostatic field (drift field) parallel to the surface is independently superimposed and transports the electrons along the buried potential channel toward a collecting electrode. In addition, the capacitance of the collecting electrode is very low and independent of the active area of the detector. It has been suggested that drift chambers can be made from a variety of semiconductors. They have been implemented successfully with 300-micron-thick high-resistivity ($10^4$ to $10^5$ ohm-era) silicon wafers. Such drift chambers are used as high-resolution position-sensing detectors for particle physics.

The silicon drift chamber approach also suffers from several drawbacks. First, rectifying junction contacts must be used to generate the depletion field and the drift field. Because of the limitation of the breakdown voltage of these junction contacts, the magnitude of usable voltage is limited. This in turn limits the thickness of the wafer that can be used for the drift detector. Second, in order to transport the charge effectively in the thin channel, a uniform drift channel must be applied. A large number of junction contacts, each with a carefully controlled, fixed voltage, is required on the wafer to generate this uniform drift field. This adds significantly to the manufacturing cost and the complexity of using the detector. Third, because of the limitation of the thickness of the detector and the low Z (~14) of the semiconductor material used, the detection efficiency for x rays and gamma rays is very low for energies above 10–20 KeV.

Both silicon detectors and detectors made of high resistivity materials, such as CdTe and CdZnTe, have employed "guard rings" around the signal electrode. A guard ring is normally kept at the same potential as the signal electrode and is used primarily to prevent dark current from the edge of a detector from reaching the signal electrode and, thereby, reducing the signal-to-noise ratio of the measurement. The guard ring does not significantly reduce low-energy tailing encountered in semiconductor detectors.

Therefore, a need exists for a semiconductor radiation detector that minimizes low-energy tailing and that obviates the disadvantages and drawbacks resident in conventional radiation detectors. The present invention provides such a radiation detector.

SUMMARY OF THE INVENTION

The present invention is a device and method for detecting ionizing radiation emanating from a source. The ionizing radiation may be high energy photons, including gamma rays and x-rays, or charged particles, including beta particles and alpha particles. It should be recognized, however, that the present invention may be used in detecting any kind of ionizing radiation.

The present invention takes advantage of the principle that a significant reduction in low-energy tailing in a semiconductor detector can be attained by a novel arrangement of electrodes that share induced charge from ionizing events in the detector, that properly shape the electric field, and that focus charge collection toward a small electrode. In implementing a semiconductor radiation detector that follows this principle, the present invention employs a detector structure having a novel arrangement of three electrodes that virtually eliminates tailing while maintaining high collection efficiency.

In accordance with the present invention, a radiation detector is provided that is capable of detecting energies from a few KeV to several hundred KeV. The detector includes three electrodes formed on the surface of a semiconductor crystal. The crystal has a plurality of sides; it preferably has a thickness of at least about 0.5 mm and is preferably formed from a semiconductor material having a high mobility-lifetime ratio. The first electrode is a bias electrode, which preferably covers the entire surface of one side of the crystal. At least one signal electrode having a small area is preferably formed on the opposing side of the crystal from the bias electrode. A control electrode is preferably disposed on the same side containing the signal electrode.

More particularly, in the present invention, the control electrode is formed on the same side of the semiconductor crystal as the signal electrode (or anode), and the bias electrode (or cathode) covers substantially the entire surface of the opposite side of the crystal. Preferably, the semiconductor crystal is formed from CdZnTe or CdTe. In the simplest configuration, the anode is a small contact point located near the center of the electron-charge-collection side of the crystal. The anode is coupled to ground through a large-value resistor and to external signal circuitry. The cathode is coupled to a voltage source that maintains the cathode at a negative voltage level relative to the anode. Preferably, the control electrode is much larger in area than the anode and forms a single ring surrounding the anode. The control electrode is maintained at a voltage level that is negative with respect to the anode, but generally not more negative than the cathode.

This configuration virtually eliminates low-energy tailing when measuring the energy of ionizing radiation. When ionizing radiation is absorbed in the radiation detector, a charge cloud is generated that induces charge initially on all electrodes. The amount of charge induced on each electrode is a function of the distance of the charge cloud from that electrode and the area of the electrode. Because of its small size, the charge on the anode is very small until a charge cloud comes close to the anode. In addition, the control electrode helps shape the electric field to focus the electron clouds toward the anode. As the electron charge cloud drifts towards the anode, the charge induced on the anode remains very small, and the charge on the control electrode builds up until the charge cloud attains a distance from the anode on the order of the size of the anode. The charge on the anode then builds up rapidly to the full value of the charge cloud, while the charge on the control electrode drops rapidly to zero. Hole charge clouds drift toward the cathode and away from the anode, and the effects of hole-trapping in the semiconductor are seen primarily by the control electrode and the cathode. Thus, the signal charge, which is the accumulated charge induced on the anode, essentially equals that of the full electron charge cloud, regardless of its position of origin. Removing from the signal its dependence on position of the ionizing event virtually eliminates low-energy tailing.

The sharing of induced charge between anode and control electrode and the build-up and decline of induced charge on the respective electrodes can be understood conceptually in terms of capacitances between a charge cloud and the electrodes and the inter-electrode capacitances.

Another benefit of the small anode is in establishing field concentration that accelerates charge clouds in the vicinity of the anode. This field concentration is enhanced by the voltage applied to the control electrode. As a charge cloud drifts from its point of origin to the anode, the fraction of charge induced on the anode in any small time increment is a function of the lift velocity. This velocity is increased substantially near the anode by the field concentration, with the result that a large fraction of the total charge is induced on the anode within a small distance from the anode. Thus, the field concentration further reduces the dependence of the signal charge on the position of charge cloud generation.

The field concentration near the anode results in faster rise-time pulses in the external circuitry and also more uniformity of rise-times among pulses. This has the potential benefit of reducing any gain variations in amplification due to pulse rise-time.

The details of the preferred embodiment of the present invention are set forth in the accompanying drawings and the description below. Once the details of the invention are known, numerous additional innovations and changes will become obvious to one skilled in the art.

BRIEF DESCRIPTION OF THE DRAWINGS

Like reference numbers and designations in the various drawings indicate like elements.

DETAILED DESCRIPTION OF THE INVENTION

Throughout this description, the preferred embodiment and examples shown should be considered as exemplars, rather than as limitations on the present invention.

Figure 5A:
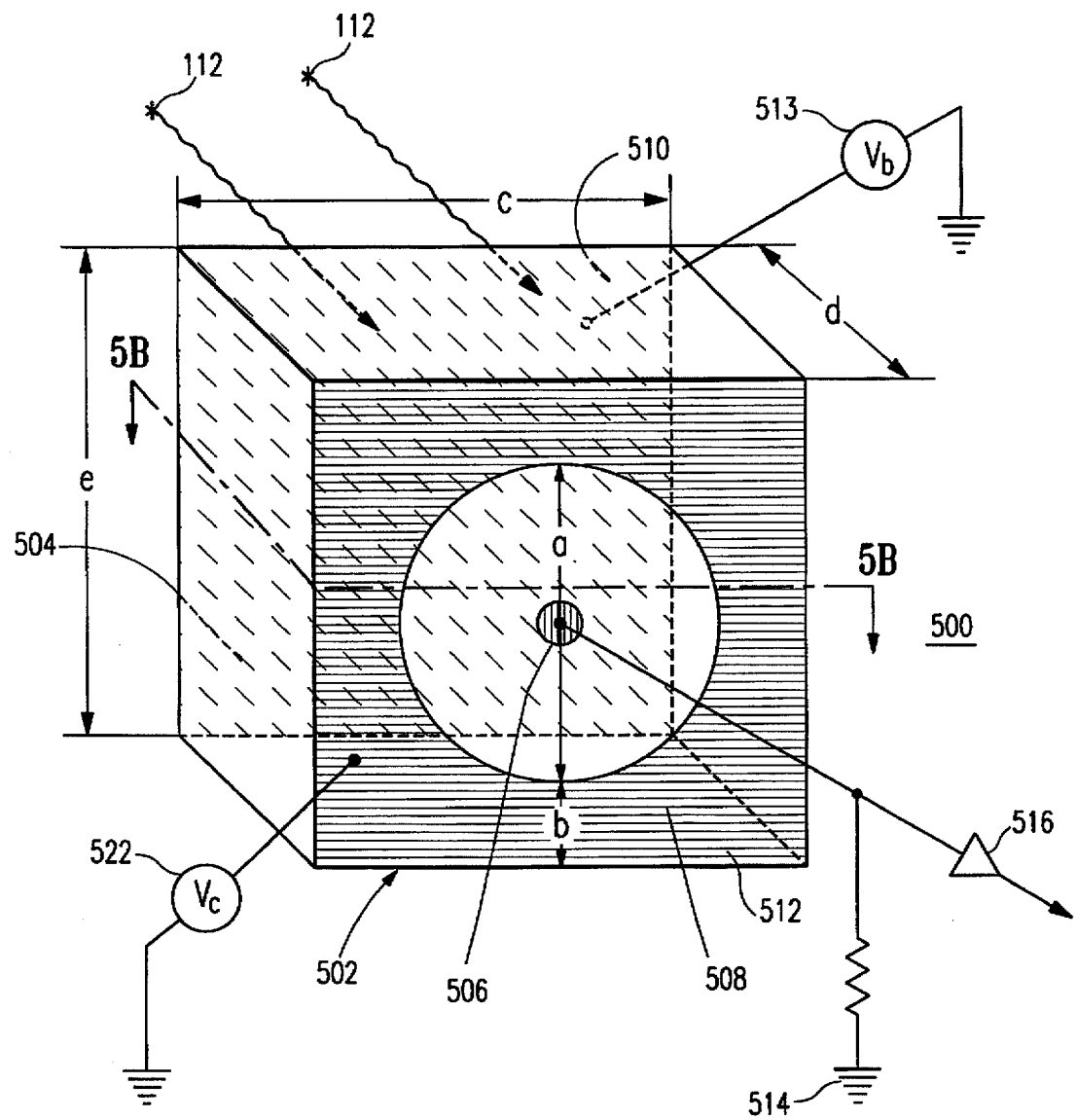
FIG. 5A is a perspective view of the preferred embodiment of a single element configuration of the present invention.

I. Physical Characteristics of The Radiation Detector of The Present Invention FIG. 5A is a perspective view of the preferred embodiment of a single-element (or single-pixel) radiation detector 500 of the present invention. While a single-element detector is shown, it should be understood that the detector of the present invention is not limited to the single-element embodiment and can be used in any multi-element configuration. Thus, a number of single-element detectors 500 can be grouped together to form an array of single-element detectors, or, in accordance with the principles of the present invention, a monolithic detector array can be fabricated. An example of such a monolithic detector array is shown in FIG. 10 and described below.

The single-element detector 500 of FIG. 5 is preferably capable of detecting energies in the range from a few KeV to over 1 MeV. The detector 500 includes a semiconductor crystal 502, a bias electrode 504, a signal electrode 506, and a control electrode 508. Appropriate biasing of the electrodes creates an electric field within the crystal 502. Ionizing radiation 112 absorbed in the detector 500 causes ionizing events within the crystal 502. The ionizing events, in turn, result in charge clouds that are guided by the electric field toward the signal electrode 506.

For the following discussion, it is assumed that the mobility-lifetime product for electrons is greater than for holes. One skilled in the art will recognize that, for the reverse condition, in which the mobility-lifetime product for holes is greater than that for electrons, electric polarity would also be reversed.

A. The Semiconductor Crystal

The semiconductor crystal 502 is a slab or wafer of high-resistivity, high Z (greater than about 34) semiconductor material. Preferably, the crystal consists of a slab of high-resistivity CdZnTe, which can operate at room temperature and can be fabricated into detectors. Alternatively, the crystal 502 may be formed from CdTe, $HgI_2$, PbI, or other semiconductor materials that have high-resistivity and that can be fabricated into detectors. Of course, those skilled in the art will recognize that virtually any semiconductor material may be used in the present invention.

When used in a spectroscopic mode, detectors made from CdZnTe or CdTe yield many lower-energy pulses in addition to the characteristic pulse amplitude for any particular energy of ionizing radiation. That is, such crystals produce significant low-energy tailing. Thus, it is especially important in radiation detectors in which the semiconductor slab is fabricated from CdZnTe or CdTe to design the detector in such a way that minimizes tailing. The present invention provides a detector structure that virtually eliminates tailing and thus is particularly well-suited to CdZnTe and CdTe-based semiconductor radiation detectors.

As shown in FIG. 5, the semiconductor crystal 502 is preferably a rectangular parallelepiped. The crystal 502 may, however, have virtually any desired volumetric shape, including cubic, hemispherical, cylindrical, conic, or rhombic. In one experimental embodiment, the crystal 502 was square on sides 510 and 512, with dimensions "c" and "e" each being about 6.1 mm, and with a thickness "d" of about 3 mm. It should be understood, however, that the dimensions of FIG. 5 are merely exemplary and that the dimensions depend primarily on the application in which the detector is being used and on the measurement conditions. Thus, the crystal 502 may have a smaller or larger surface area on sides 510 and 512. Typically, the surface area of the sides 510, 512 ranges from about one to several hundred square millimeters.

The crystal 502 may have a thickness "d" of greater or less than 3 mm. Preferably, however, the thickness is greater than about 0.5 mm, with the typical range being between approximately 1 mm and 10 mm. (The effect of varying the thickness of the crystal 502 will be described in greater detail below.) Those skilled in the art will recognize that the crystal shape and dimensions may be varied alone or in combination to achieve special performance results or to improve manufacturability.

The novel structure of the present invention can be used with virtually any semiconductor or insulating detector material having a resistivity greater than about 10 megohm-cm. If the semiconductor resistivity is less than 10 megohms, the resistivity may be effectively increased to this value by creating a Shottky barrier or p-n junction at one of the electrodes.

B. The Bias Electrode

The bias electrode 504 is formed as a conductive layer (e.g., by metallizing) on substantially the entirety of the surface of side 510 of the crystal 502. (In the embodiment shown in FIG. 5, the ratio of the electron mobility-lifetime product to the hole mobility-lifetime product is greater than 1, and the bias electrode 504 thus acts as a cathode and will be referred to as such for the remainder of this description. Of course, if the mobility-lifetime ratio were reversed, the polarity would be reversed, and the cathode 504 would act as an anode.) The cathode 504 may be formed to cover only a portion of a surface of the crystal 502, or to cover more than one surface, and/or several cathodes may be provided on side 510. Further, the cathode 504 may be formed in different shapes and with various dimensions.

The cathode 504 is set to a bias (or cathode) voltage, $V_b$, which is negative with respect to the anode 506, and which depends on the thickness "d" of the crystal 502 and on the application. For the preferred embodiment, in which the crystal 502 is about 3 mm thick, the magnitude of $V_b$ is from about −200 volts to about −1000 volts, and most preferably about −400 volts to about −500 volts. It should be understood, however, that $V_b$ may be any suitable voltage level. The cathode may be set to $V_b$ by coupling the cathode 504 to a constant external voltage source 513, or by any other suitable means for establishing and maintaining a substantially constant voltage level. Preferably, the cathode 504 is coupled to the voltage source 513 via a wire conductor.

C. The Signal Electrode

In the embodiment of FIG. 5, the signal electrode 506 is preferably a small conductive contact located at or near the center of side 512, which is the surface of the semiconductor crystal 502 opposing the side 510 on which the cathode 504 is formed in the preferred embodiment. (As explained above, in the embodiment of FIG. 5, the electron mobility-lifetime product is greater than the same product for holes, and the signal electrode 506 thus acts as an anode and will be referred to as such for the remainder of this description. If the reverse were true, the polarity would be reversed, and the anode would act as a cathode.) The anode 506 of FIG. 5A has a circular shape with a diameter of about 1 mm, the diameter being less than dimension "a." Thus, preferably, the anode 506 is a "dot" contact formed on the surface of side 512. Nevertheless, like the cathode 504, the anode 506 may be formed in a variety of shapes, such as a circle, square, rectangle, or triangle, and is not fixed dimensionally.

The anode 506 is coupled to external signaling circuitry 516, preferably via a wire connection, and via a resistor to an anode potential, which in the preferred embodiment of FIG. 5 is ground 514. Therefore, the anode 506 is at a more positive voltage level, $V_a$, than the cathode 504, which, as described above, is set to a negative voltage. In consequence, a bias voltage exists across the anode 506 and cathode 504, which creates an electric field within the crystal 502. Those skilled in the art will recognize that $V_a$ need not be at ground. Rather, $V_a$ may be any voltage level, provided, however, that $V_a$ and $V_b$ are set to different levels in order to establish a bias voltage between the cathode 504 and anode 506.

D. The Control Electrode

Figure 6:
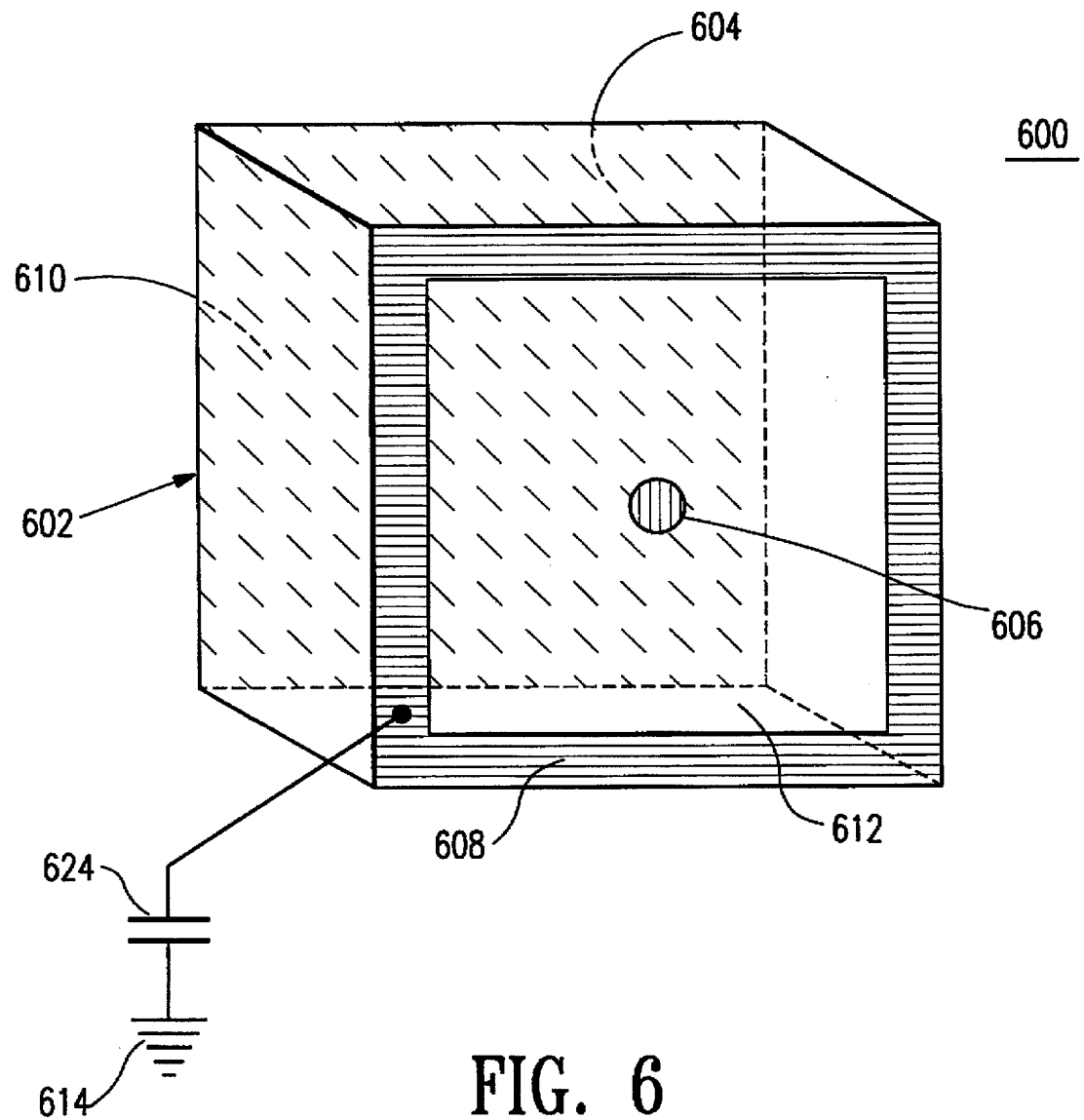
FIG. 6 is a perspective view of an alternative embodiment of the present invention.

A third electrode, the control electrode 508, is formed on the same side 512 of the crystal 502 as the anode 506 in the preferred embodiment. As shown in FIG. 5A, the control electrode 508 may be in the form of a conductive circular ring surrounding the anode 506, having an inside diameter, "a", of about 4 mm and an outside dimension, "a"+"2b", of about 6 mm. FIG. 6 shows an alternative embodiment of a radiation detector 600 of the present invention, where the control electrode 608 forms a rectangular ring at the perimeter of side 612, with the ring surrounding the anode 606. In radiation detector 600, the control electrode 608 has a width of about 0.5 mm. As defined herein, "ring" means a body or structure having any shape (for example, circular, rectangular, or square) that fully or partially encloses or substantially surrounds another body or structure. Thus, it should be understood that the control electrode 508 is not limited to a circular or rectangular ring around the anode 506, as shown in FIGS. 5A and 6, but may be in the shape of a square, triangle, or other ring shape. Moreover, the control electrode 508 need not surround the anode 506. Instead, the control electrode 508 may be an "incomplete" circle or square (rather than a complete ring) or an irregular area formed adjacent to the anode 506. Some alternative control electrode/anode configurations are described in detail below.

The control electrode 508 has a control voltage, $V_c$, which can be a constant voltage level, or may be a controlled or completely variable voltage level. Preferably, $V_c$, like $V_b$, is a negative voltage with respect to the anode. Further, the magnitude of $V_c$ is typically established so that it lies between the magnitudes of $V_b$ and $V_a$. Nevertheless, the magnitude of $V_c$ may be more negative than $V_b$. Accordingly, in the preferred embodiment, the following relationship exists between $V_a$ and $V_c$:

$$V_c < V_a$$

For many applications the maximum detector sensitivity will be at $V_c = V_b$. $V_c$ may be established in a variety of ways. For example, as shown in FIG. 5A, the control electrode 508 may be coupled to an external voltage source 522 generating a substantially constant voltage. The voltage source 522 is used to maintain the control electrode 508 at $V_c$. When the external voltage source 522 is used to establish $V_c$, current flows into or out of the control electrode 508, depending on whether the potential is greater or less than the potential that would be established by the effective resistances from the control electrode to both the anode and cathode.

Alternatively, as shown in FIG. 6, the control electrode 608 may be coupled to a capacitor 624, which is in turn connected to ground 614. The capacitor 624 can be of any type, including a discrete, monolithic, thick film, or integrated circuit capacitor, or the capacitor 624 can be the parasitic capacitance of the system. The capacitor 624 charges to a voltage determined by $V_b - V_a$ and by the values of the inherent electrical resistances from the cathode 604 to the control electrode 608 and the control electrode 608 to the anode 606. The capacitor 624 prevents $V_c$ from changing significantly as charge is swept past the control electrode 608 during signal-charge collection.

In still another alternative, $V_c$ (and $V_a$ and $V_b$, for that matter) can be established by applying an AC voltage using, for example, voltage source 522. Similarly, $V_a$, $V_b$, and/or $V_c$ can be established by applying a digital step waveform or other waveform. By applying such variable voltage sources, $V_c$ can be modulated or actively varied to thereby modulate or vary the output count rate of charge signal pulses at the anode 506.

In the preferred radiation detector 500, the position and dimensions of the control electrode 508 are such that, with only a small capacitor (e.g., about 1000 pF) attached to the control electrode 508, the control electrode 508 is maintained at about −250 volts, which is an acceptable operative value of $V_c$ when $V_b$ is about −500 volts. Thus, although the various embodiments of the radiation detector of the present invention each require three electrodes, the addition of capacitor 624 to any one of the detector embodiments allows the detector to be operated as a two-terminal device with respect to external circuitry. Alternatively, the control electrode 508 and cathode 504 may be connected together, and the detector 500 can be operated as a two-terminal device with respect to external circuitry, with $V_c$ equal to $V_b$. Moreover, as will be described in more detail below, with the control electrode 508 held near an optimum $V_c$, nearly all electron charge clouds in the semiconductor crystal 502 are collected by the anode 506. Thus, nearly all low-energy tailing is eliminated, and the detection efficiency is very high. The control electrode 508 also minimizes effects from defects in the edges of the crystal 502.

E. Electrode Configurations and Features

Figure 7:
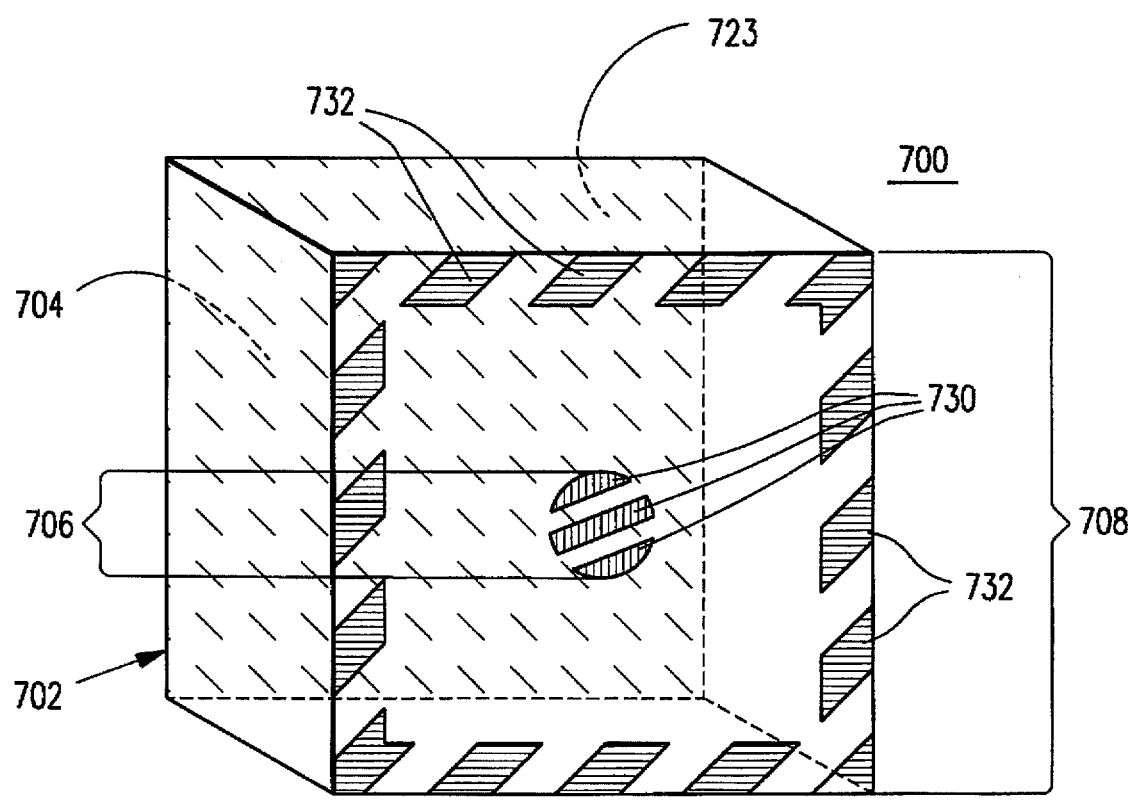
FIG. 7 is a perspective view of another embodiment of the present invention showing a segmented control electrode.

FIG. 7 illustrates an alternative embodiment of the present invention having a segmented anode 706 and control electrode 708. The anode 706 of FIG. 7 is segmented into a plurality of segments 730, and the control electrode 708 is also segmented into a plurality of segments 732. Both the anode 706 and control electrode 708 may have any number of segments 730, 732, and the segments may take virtually any shape. Moreover, all of the segments 730, 732 of a single anode 706 or control electrode 708 need not have the same shape or the same dimensions. Each segment in a single electrode, therefore, may have its own shape and size.

The different segments 730, 732 may be set at different voltages in order to optimize the electric field distribution within a semiconductor crystal 702. Those skilled in the art will recognize that, through simulation and/or experimentation, such optimizing voltages can be selected empirically.

Figure 8:
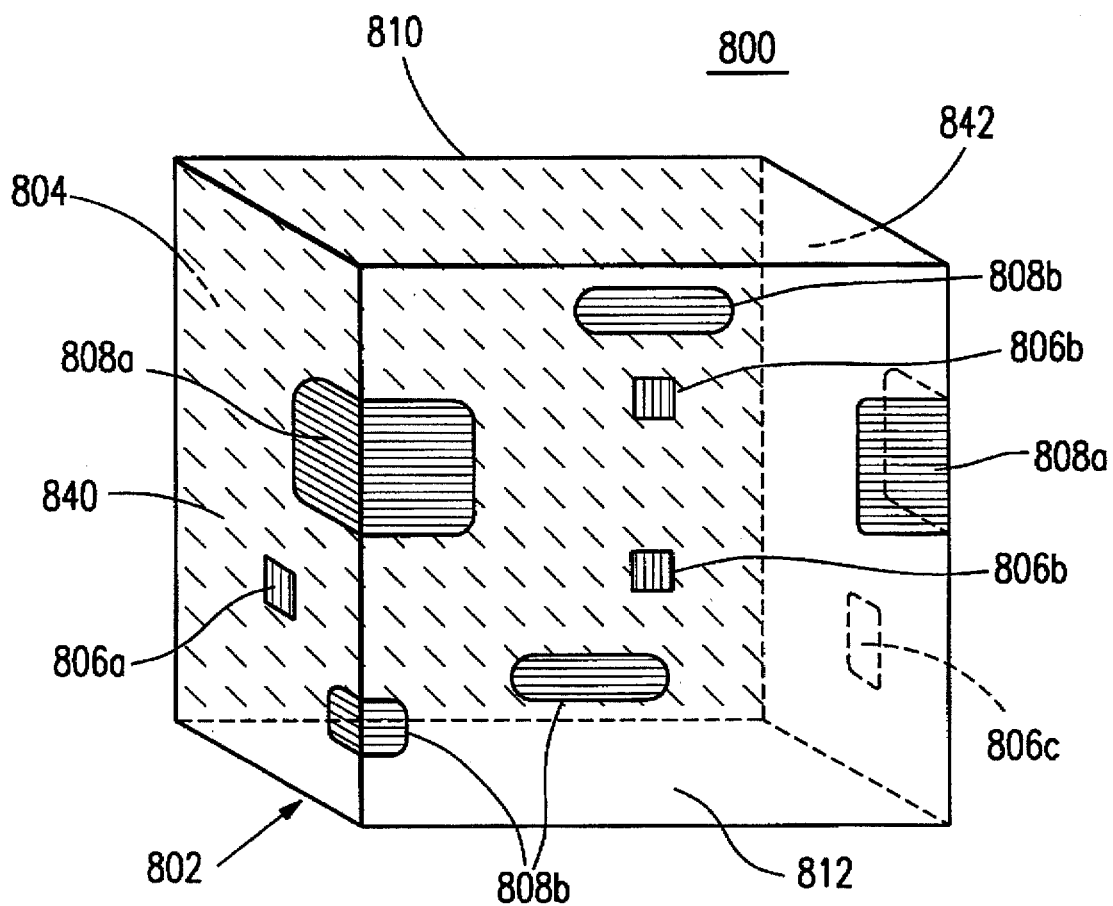
FIG. 8 is a perspective view of yet another embodiment of the present invention showing multiple control electrodes and multiple anodes.

Alternatively, as shown in FIG. 8, more than one control electrode 808 and anode 806 may be formed on a semiconductor crystal 802. The various control electrodes 808 can take any shape and size, and may be placed in various positions relative to the anode 806. As with the segments 730, 732, the different control electrodes 808 can be set at different voltages to optimize electric field distribution. In addition, the control electrodes 808 can be formed at various locations on the crystal 802 to optimize the electric field distribution.

As is also shown in FIG. 8, neither the control electrodes 808 nor the anodes 806 need be located on a surface of the detector 800 opposite to that of the cathode 804. For example, in the detector 800 of FIG. 8, the cathode 804 is formed on a first surface 810 of the cubic semiconductor crystal 802. A first control electrode 808a and the anode 806a are both formed on a second surface 840 adjacent to the first surface 810. A second set of control electrodes 806 and anodes 808b are formed on a third surface 812 opposite to the first surface 810. Alternatively, the crystal 802 could have a control electrode 808 on adjacent surface 840 and the anode 806c on another adjacent surface 842. It should be understood from the above that any distribution of the anode and control electrodes on the crystal is possible, so long as the electric field in the crystal is formed to focus the electron charge cloud toward the anode and to shield the anode from the effects of hole trapping.

Further, none of the cathode nor anode nor control electrode need be restricted to a single surface of the crystal. For example, as shown in FIG. 8, control electrodes 808b extend from one sin-face of the crystal, around the edges to adjacent surfaces. The electrodes can even extend to more than one adjacent surface. Alternatively, an electrode may be in the form of a band fully or partially encircling the crystal.

Figure 11:
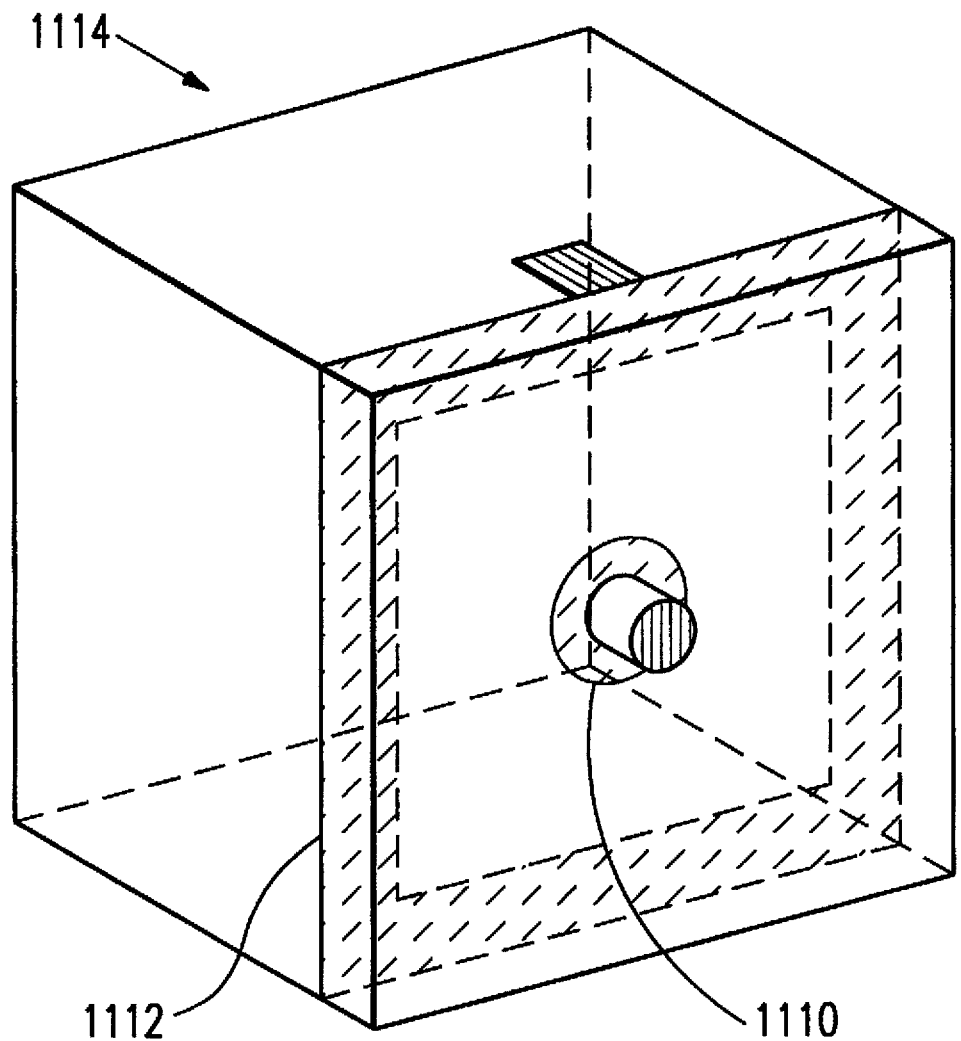
FIG. 11 is a perspective view of a radiation detector having buried electrodes.

The electrodes can be formed on or in the crystal 502 using a variety of techniques. Preferably, the electrodes are gold films, commonly used in CdZnTe detector manufacture, electrochemically deposited on the surface of the crystal 502. Alternatively, other conducting materials, including platinum, rhodium, and other metals, can be electrochemically deposited on the crystal surface 502 to form the electrodes. Those skilled in the art will recognize that nearly any conductor may be used for the electrodes. As an alternative to electrochemical deposition, the electrode material may be deposited on the crystal 502 via evaporation, sputtering, or surface alloying. The electrodes may be formed by other techniques as well, such as ion beam deposition and chemical vapor deposition of conductive materials. The electrodes may be formed in a variety of configurations, including mesa, trenched, and buried configurations. FIG. 11 illustrates a buried anode 1110 and control 1112 electrode in a radiation detector 1114.

Separation between the electrodes can be achieved in a variety of ways. For example, the electrodes can be separated by modifying the surface of the crystal 502, and/or by a bulk material on the surface of the crystal (i.e., by passivation or resistive layers formed by any process).

The electrodes are preferably ohmic contacts. Nevertheless, the electrodes of the present invention need not be ohmic; they could be rectifying, a p-n junction, or some other type of contact.

II. Operation of the Radiation Detector

The operational aspects of the radiation detector of the present invention will be described with reference to the preferred embodiment of FIG. 5. Nevertheless, it should be recognized that the principles described below apply to any embodiment of the present invention.

A. Theory of Operation

Following is a discussion of what is believed to be the physical basis for the operational characteristics of the invention. While sound theoretical considerations indicate that this theory of operation of the present invention is correct, it should be understood that the utility of the invention does not rest on the correctness of the following discussion. Further, although the following description refers to radiation detector 500 of FIG. 5, it should be understood that the principles and theories described are applicable to any configuration of the present invention.

The semiconductor crystal 502 has electrons and holes. When an ionizing event occurs within the crystal 502, electrons and holes are formed into electron and hole charge clouds that are transported in a particular manner within the crystal 502. As explained above, the essential electron and hole parameters describing transport properties are (1) mobility, $\mu$, which determines how fast an electron or hole travels in a particular electric field, and (2) trapping lifetime, $\tau$, which is the average time an electron or hole generated by an ionizing radiation remains free and able to participate in the transport process. The mobility-lifetime product ($\mu\tau$) is a critical parameter to consider in analyzing semiconductor radiation detectors, and there is a mobility-lifetime product for electrons, $(\mu\tau)_e$, and a mobility-lifetime product for holes, $(\mu\tau)_h$. The mobility-lifetime product generally differs significantly for electrons and holes in a particular semiconductor. If electrodes are formed on the semiconductor and a voltage potential established between the electrodes, an electric field, E, in the semiconductor will cause the electrons to drift to the anode and the holes to the cathode.

In semiconductors such as CdTe and CdZnTe, the mobility-lifetime product for electrons is generally much larger than that for holes, with the mobility-lifetime ratio, $(\mu\tau)_e/(\mu\tau)_h$, typically being greater than 10. (The principles described below, however, also apply to semiconductor detectors for which $(\mu\tau)_h/(\mu\tau)_e$ is smaller or larger.) The mobility-lifetime ratio may be even higher in other high resistivity semiconductors, such as $HgI_2$ and $PbI$. For conceptual purposes, assure that the mean-free path ($\mu\tau E$) is large for electrons and small for holes with respect to the detector thickness. Essentially all electrons generated by ionizing radiation reach the anode, and many of the holes are trapped before reaching the cathode. Under these conditions, the amount of charge transported in a planar detector will depend strongly on the position within the crystal at which the ionizing event occurs. If the event occurs very near the cathode, electrons will be swept all the way across the crystal to the anode, holes will be swept to the cathode, and the full charge deposited by the ionizing radiation will be sensed in the external circuit. If the event occurs near the anode, the electrons will be swept to the anode, but holes will be trapped, and the net effect will produce a much reduced output signal. In between, the fraction of deposited charge induced in the external circuit is a function of the distance from the anode at which the event occurs. The dependence of charge response on the position at which the event occurs is the source of unwanted low-energy tailing in planar detectors.

With the three-electrode detector of the present invention, at least three factors contribute to the elimination of low-energy tailing.

First, the low-energy tailing is reduced approximately by the ratio of the areas of the anode 506 and control electrode 508. When a charge cloud is generated by an ionizing event in the detector 500, charge is induced on all electrodes. The electric field 518 established by the voltages on the electrodes guides the electron cloud to the anode 506 and the hole cloud to the cathode 504. The charge induced on the control electrode 508 is, in general, initially much larger than the charge on the anode 506 because of the relative capacitances between the charge clouds and the anode 506 and the control electrode 508 (approximately the ratio of their areas). This condition is true except when a charge cloud is closer to the anode 506 than to the control electrode 508. As an electron cloud arrives at the anode 506, it accelerates as it gets very near because of the high concentration of electric field 518 at the anode 506, and the charge on the anode 506 builds up very rapidly to the full value of the electron cloud. Conversely, as hole clouds move to the cathode 504, their effect on the anode 506 diminishes. Thus the effects that produce low-energy tailing in planar detectors are reduced from the anode signal by an amount that is approximately the ratio of the anode area to the cathode area. Thus, the signal charge, which is the total charge collected by the anode 506, is essentially the full charge of the ionizing event, regardless of the position at which the event occurred within the crystal 502. It can be seen that this method of detection removes from the anode charge response its dependence on the position of the ionizing event, which is the source of unwanted low-energy tailing. Furthermore, the negative bias on the control electrode 508 inhibits the collection of electron charge clouds by the control electrode 508, thus maintaining high collection efficiency.

Figure 5B:
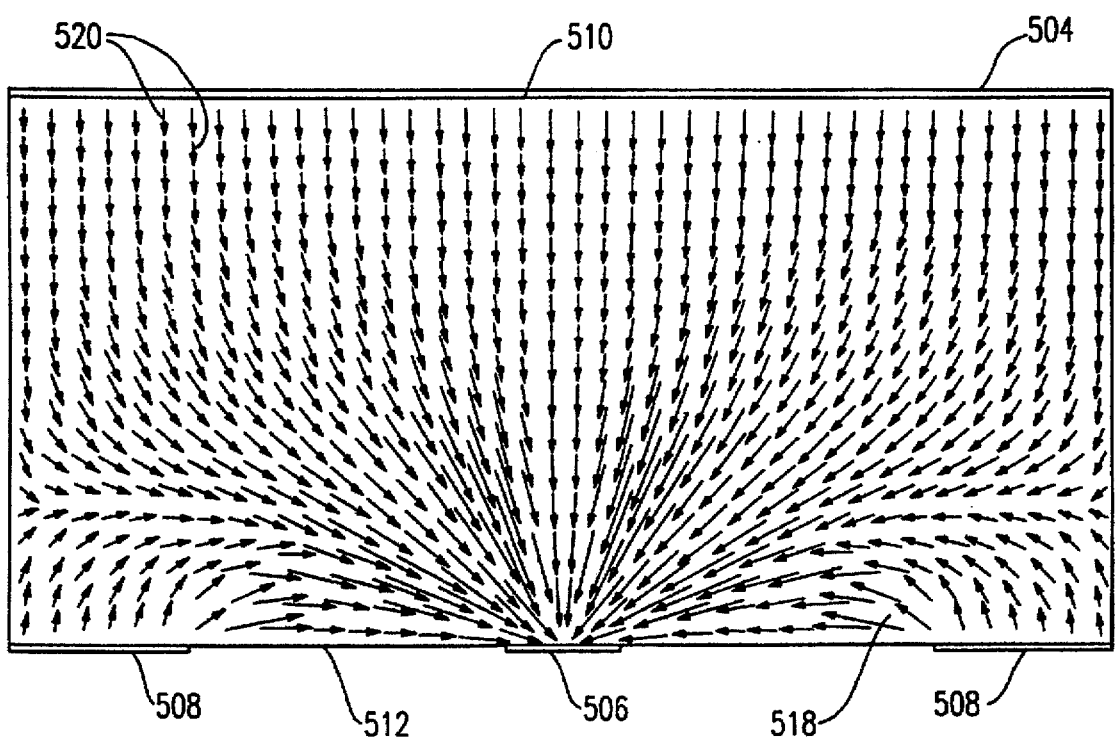
FIG. 5B is a cut-away side view of the embodiment illustrated in FIG. 5A taken along line 5B—5B, showing the electric field created in the semiconductor crystal.

Second, electric field shaping helps reduce low-energy tailing. FIG. 5B is a cut-away side view of the radiation detector 500 of FIG. 5A, showing a calculated electric field 518 that is believed to be created by the preferred three-electrode configuration. As can be seen in FIG. 5B, the electric field 518 is characterized by field paths 520 within the crystal 502 that are uniformly parallel for most of the distance between cathode 504 and anode 506. The field paths become highly concentrated as they closely approach the anode 506. Because the fraction of charge induced on the anode 506 is a function of the velocity of the charge clouds, and because the electric field 518 concentration causes the drift velocity to increase as the clouds approach the anode 506, a large fraction of the total charge is induced on the anode 506 within a short time. Enhancement of field concentration at the anode 506 by the control electrode 508 results in a charge signal at the anode 506 that has a faster rise time and minimizes the variance in rise times that are normally encountered in semiconductors such as CdTe and CdZnTe. This in turn results in more uniform amplification by external circuits 516 that have finite clipping times.

Third, the control electrode 508 also removes some of the charge clouds that have poor transport properties as a result of being generated near the perimeter of the crystal 502 where structural defects may be more frequently encountered. Such charge clouds cause low-energy tailing. Nevertheless, by adjusting the voltage of the control electrode 508, such charge clouds can be collected by the control electrode 508 instead of the anode 506, thereby preventing such charge clouds from causing low-energy tailing.

B. Example of Operation for an Actual Detector

Figure 9:
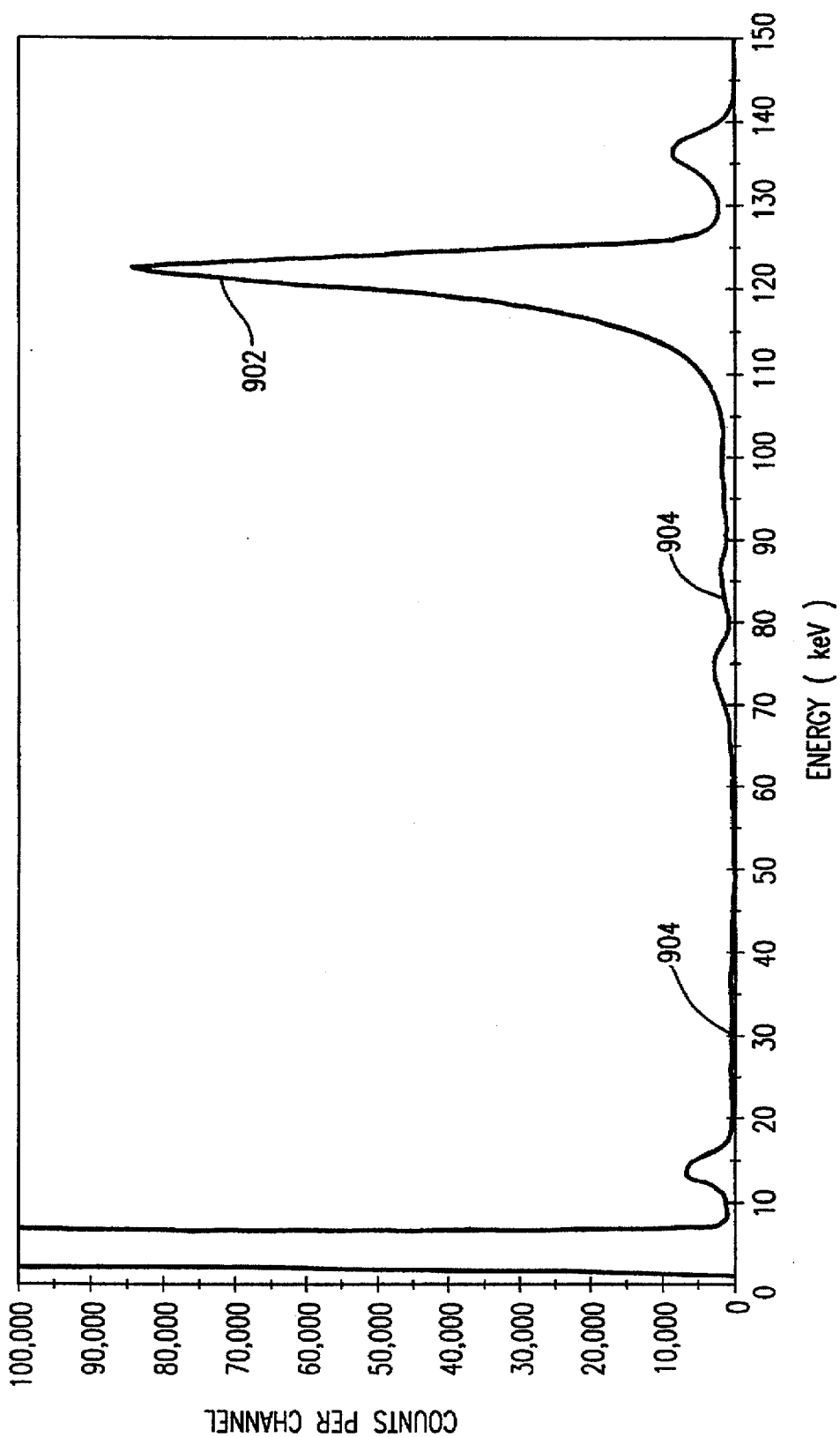
FIG. 9 is an energy pulse histogram for the preferred embodiment of the present invention illustrated in FIG. 5, employing a CdZnTe semiconductor.

FIG. 9 shows a signal pulse histogram of the gamma radiation from Tc-99 mm for an actual radiation detector configured in accordance with detector 500 of FIG. 5. The actual detector employed a rectangular parallelepiped CdZnTe semiconductor crystal. The dimensions of the crystal were about 6.1 mm by 6.1 mm on the sides, with a thickness of about 3 mm. The detector had a cathode covering one surface of the crystal and an anode and control electrode on the opposite surface, with $V_a=0$ volts, $V_b=-450$ volts, and $V_c=-250$ volts.

Figure 1:
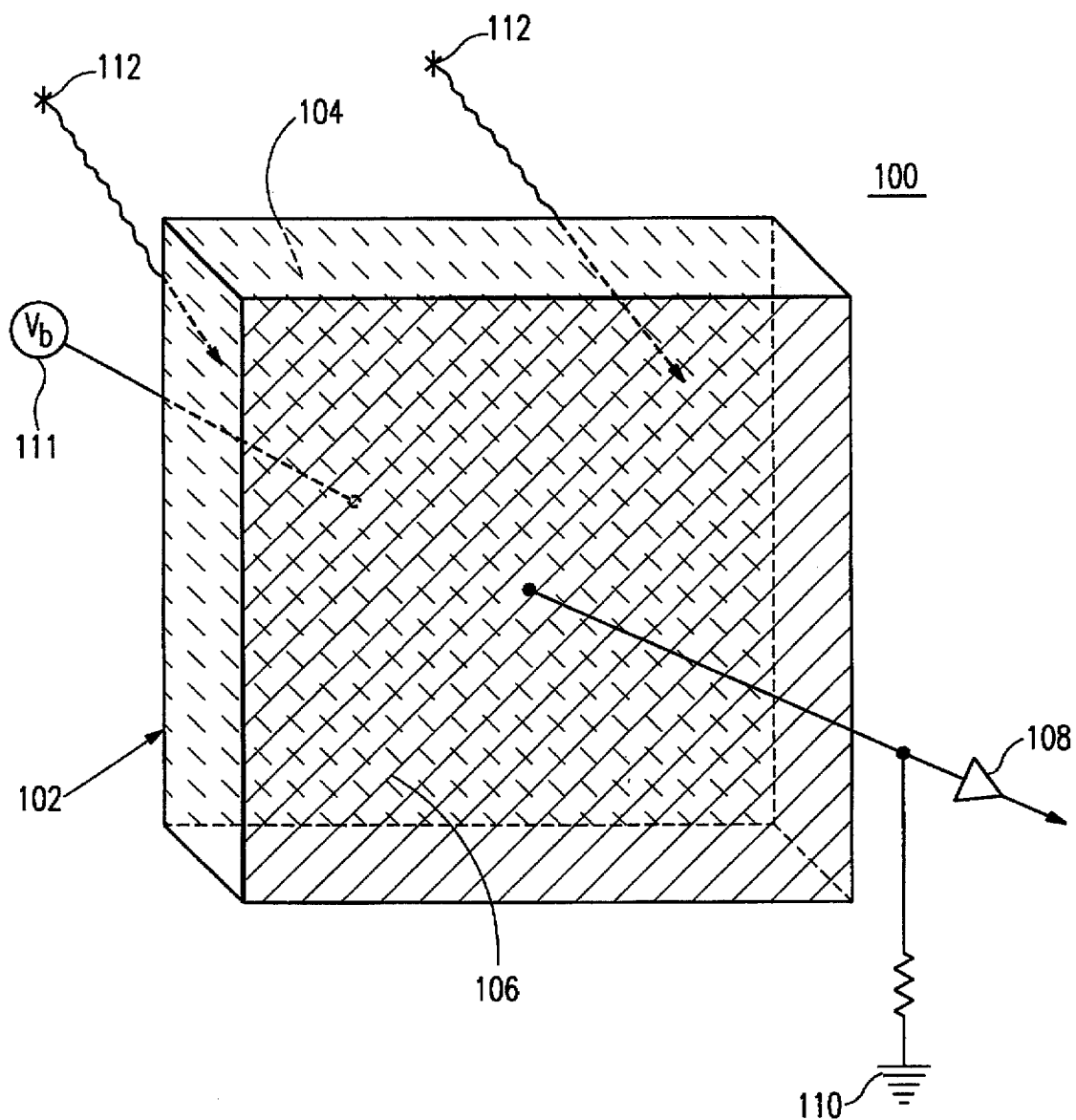
FIG. 1 is a perspective view of a prior art planar radiation detector.
Figure 2:
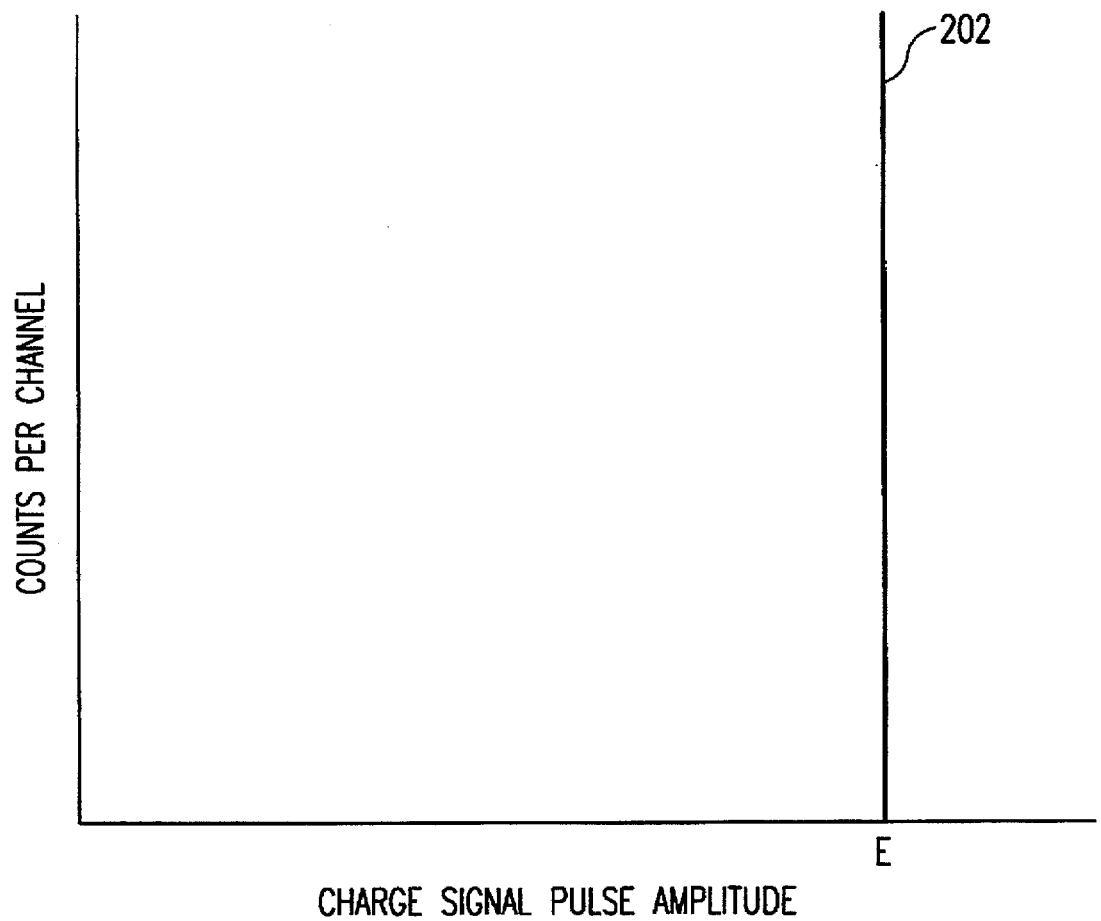
FIG. 2 is an energy pulse histogram for an ideal radiation detector in which counts per channel are plotted versus charge signal pulse amplitude.
Figure 3:
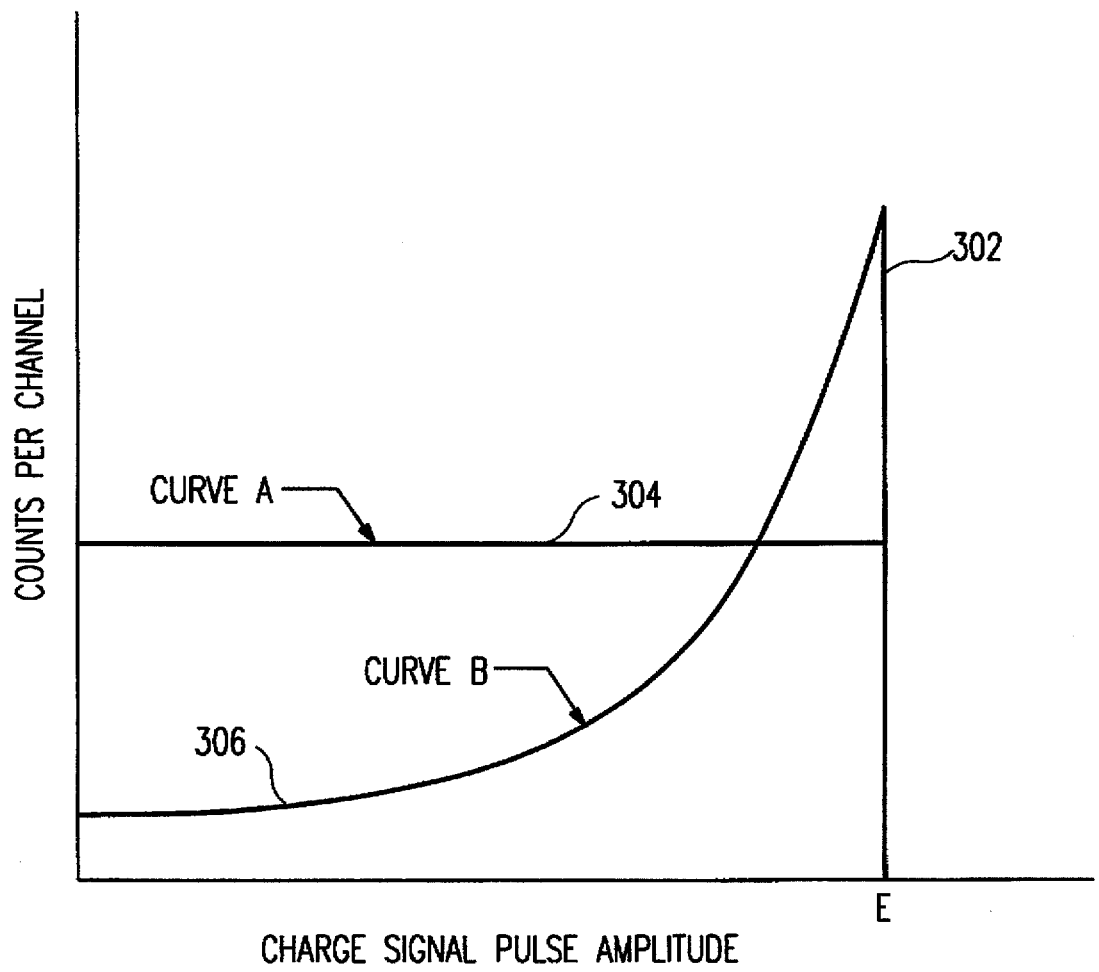
FIG. 3 is an energy pulse histogram for two different radiation detectors, in which Curve A represents the histogram that results if the ionizing radiation are absorbed uniformly throughout the semiconductor crystal, and Curve B represents the histogram that results if absorption is large near the cathode and drops off exponentially as the ionizing event moves in a direction away from the cathode.
Figure 4:
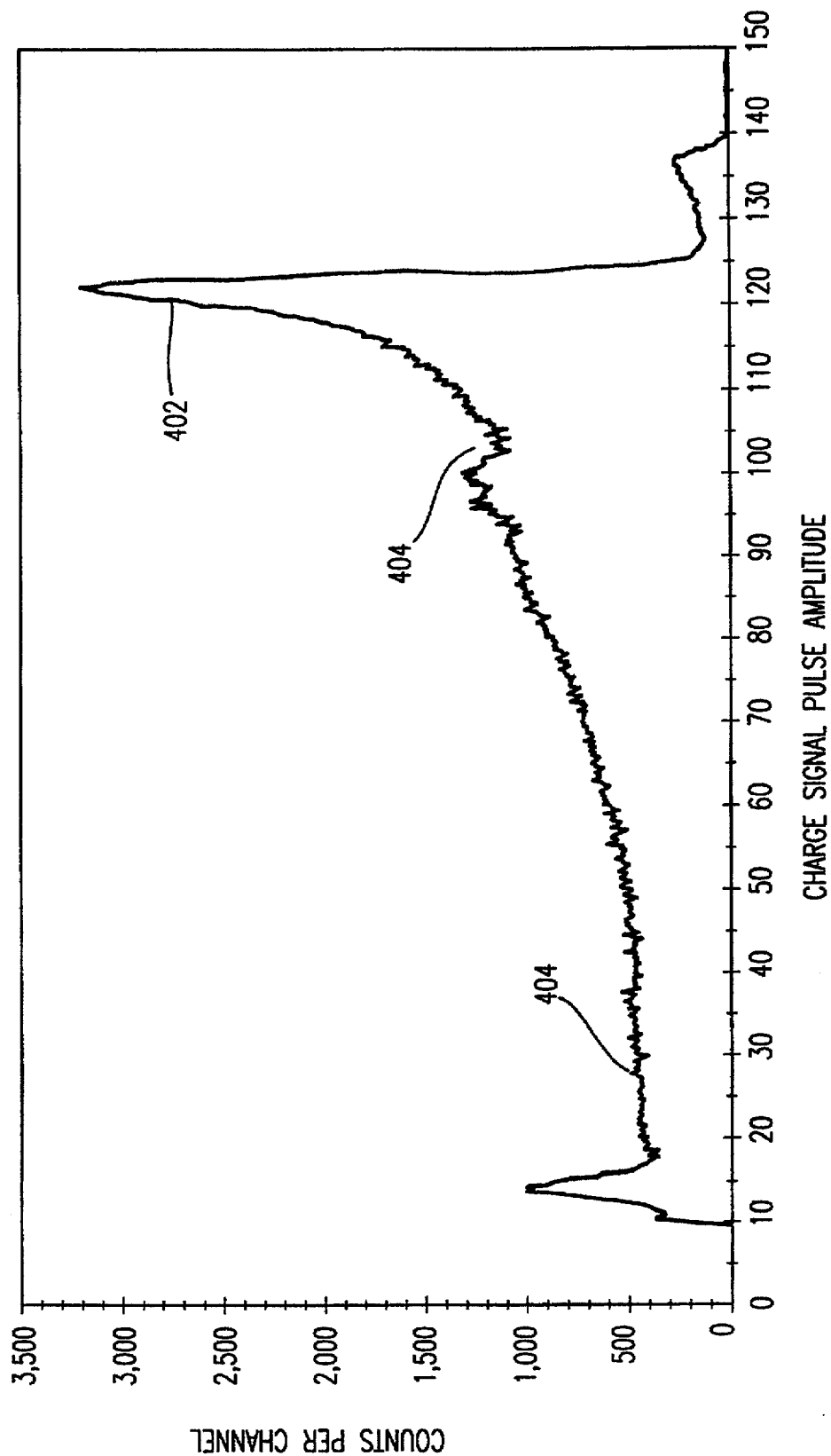
FIG. 4 is an energy pulse histogram for an actual prior art CdZnTe planar detector, illustrating low-energy tailing.

FIG. 9 clearly demonstrates the virtual elimination of low-energy tailing that can be achieved with the present invention. A large photopeak 902 exists at the energy level of the ionizing radiation, and only a small amount of low-energy pulses were detected, indicated by tail 904. The reduction in tailing achieved with the detector of the present invention is evident in comparing the histogram FIG. 9 with that of FIG. 4. The histogram of FIG. 4 was acquired with a conventional CdZnTe planar detector with the same crystal dimensions and quality as that of FIG. 9. As can be seen, FIG. 4 has a broadened photopeak 402 at the target energy, indicating a degradation of resolution, and a substantial amount of low-energy tailing 404, indicating a reduction in peak efficiency. It is interesting to note the relative amplitudes of the three energy peaks. The total counts in the peaks should be proportional to the emission probabilities for those peaks. For cobalt-57, those probabilities are: 1) 14.413 KeV–9.14%, 2) 122.06 KeV–85.68%, and 3) 136.45 KeV–10.67%. In FIG. 9, the relative magnitudes of counts in the peak are very close to those emission probabilities, while, in FIG. 4, it appears that at least half of the counts that should be in the peaks are in the low-energy tails of the higher energy peaks. (The two curves of FIGS. 4 and 9 were obtained with detectors of identical dimensions and identical surrounding materials; therefore, the two curves can be compared for relative peak amplitudes, although direct comparison of peak amplitudes cannot be made without photon absorption data for each peak.)

Accordingly, as evidenced by the histogram of FIG. 9, the addition of the control electrode 508 and its affect on the shape of the electric field 518 results in virtual elimination of low-energy tailing. The detector of the present invention therefore achieves high-resolution and collection efficiency, despite the charge transport problems inherent in high-resistivity, large-mobility-lifetime-ratio semiconductor materials. Furthermore, the present invention is simple and inexpensive to manufacture.

C. Additional Aspects and Features of Operation

The magnitude of $V_c$ can be established by experiment. If the magnitude of $V_c$ is too small, the anode 506 will collect only some of the electron clouds, and the collection efficiency of the radiation detector 500 will be low. The optimum value for $V_c$ is dependent on electrode geometry. In the radiation detector 500 of FIG. 5, the preferred value of $V_c$ is in the range from $(V_a+V_b)/2$ to $V_b$.

The resistances between the cathode 504 and control electrode 508 and between the control electrode 508 and anode 506 can be tailored to achieve specific performance results. This is done by varying the electrode geometry and by changing bulk or surface resistivity by ion damage, ion implantation, thermo-chemical treatment, and/or other means.

The radiation detector of the present invention can be used with nearly any crystal thickness. Preferably, however, the thickness is at least about 0.5 mm. The only limitation on the thickness is that the larger $\mu\tau$ product (i.e., $(\mu\tau)_e$ or $(\mu\tau)_h$) must be sufficiently large for most of the charge carriers to traverse the thickness of the crystal. For state-of-the-art CdZnTe, this thickness is approximately 10 mm. For a single anode on a crystal, the useful area of the detector may be limited by the maximal anode capacitance that can be accommodated by the electronics and by the ability to form an electric field that will guide the electron clouds to the anode. Large areas may be achieved by appropriate geometries for the anode and the control electrode. Larger areas may also be used by forming grid structures similar to the detector array configuration described below, but with the anodes connected together.

Thus, the thickness of the semiconductor crystal of the present invention can be substantial and, thereby, can provide high sensitivity and high detection efficiency for a wide range of radiation energies.

In the radiation detector of the present invention, and as shown in FIG. 5B, the electrodes are situated and biased in such a manner as to create an electric field 518 that guides charge clouds along a direction substantially perpendicular to the surface 510 on which radiation 112 impinges on the detector 500 and substantially parallel to the impinging radiation 112.

The value of $V_b-V_a$ is chosen based on the thickness of the semiconductor crystal and the requirement of the application. For a 3 mm thick crystal, $V_b-V_a$ may be about $-400$ volts.

If an embodiment of the new device is maintained in a constant flux of ionizing radiation, varying the voltage ($V_c$) of the control electrode 508 below its optimum value will cause the count rate to vary in a corresponding manner. Thus, the radiation detector of the present invention can be used to modulate the signal from a beam of ionizing radiation.

III. Detector Array Embodiment

Figure 10A:
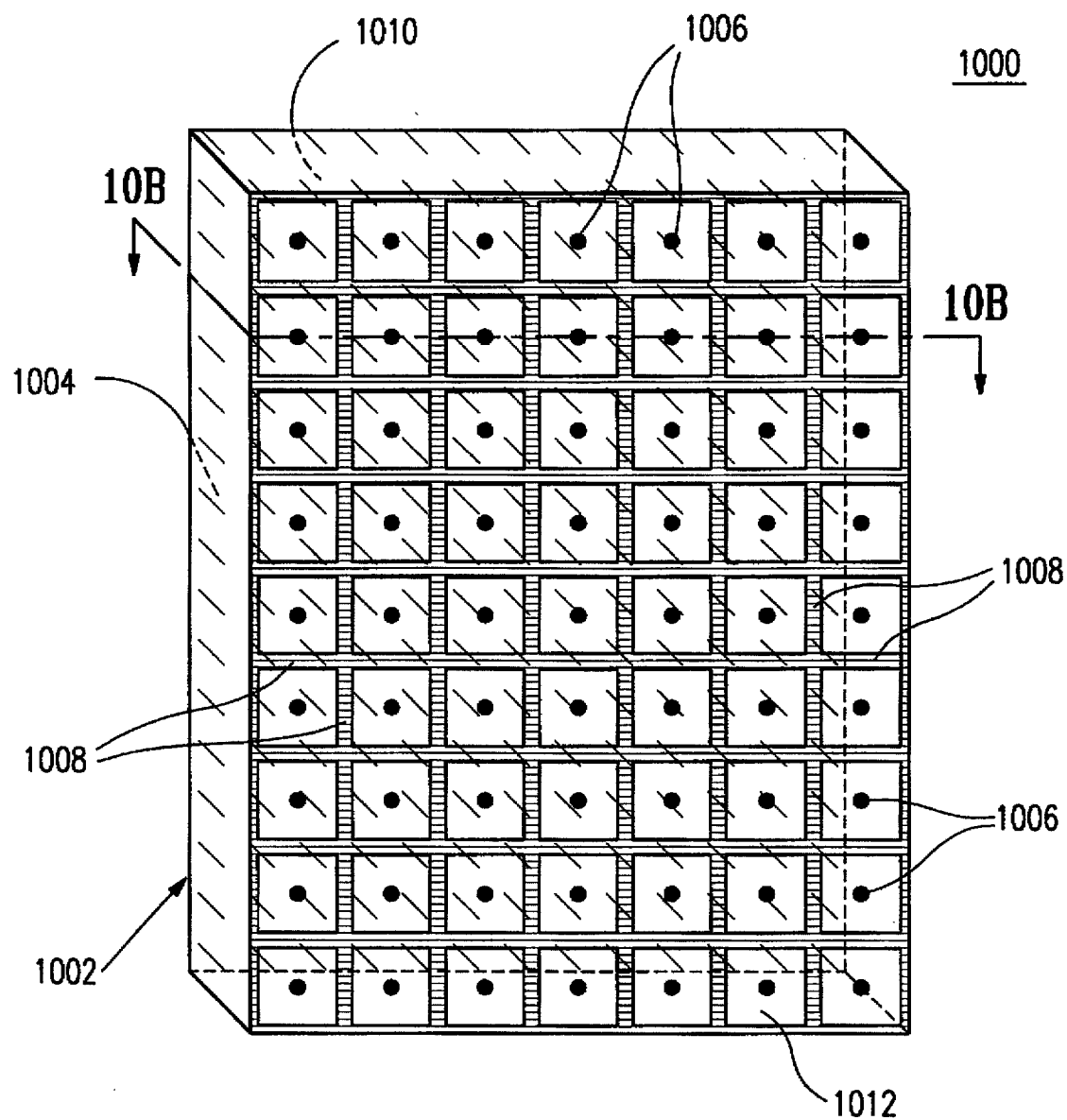
FIG. 10A is a perspective view of an alternative embodiment of the present invention showing a detector array structure.
Figure 10B:
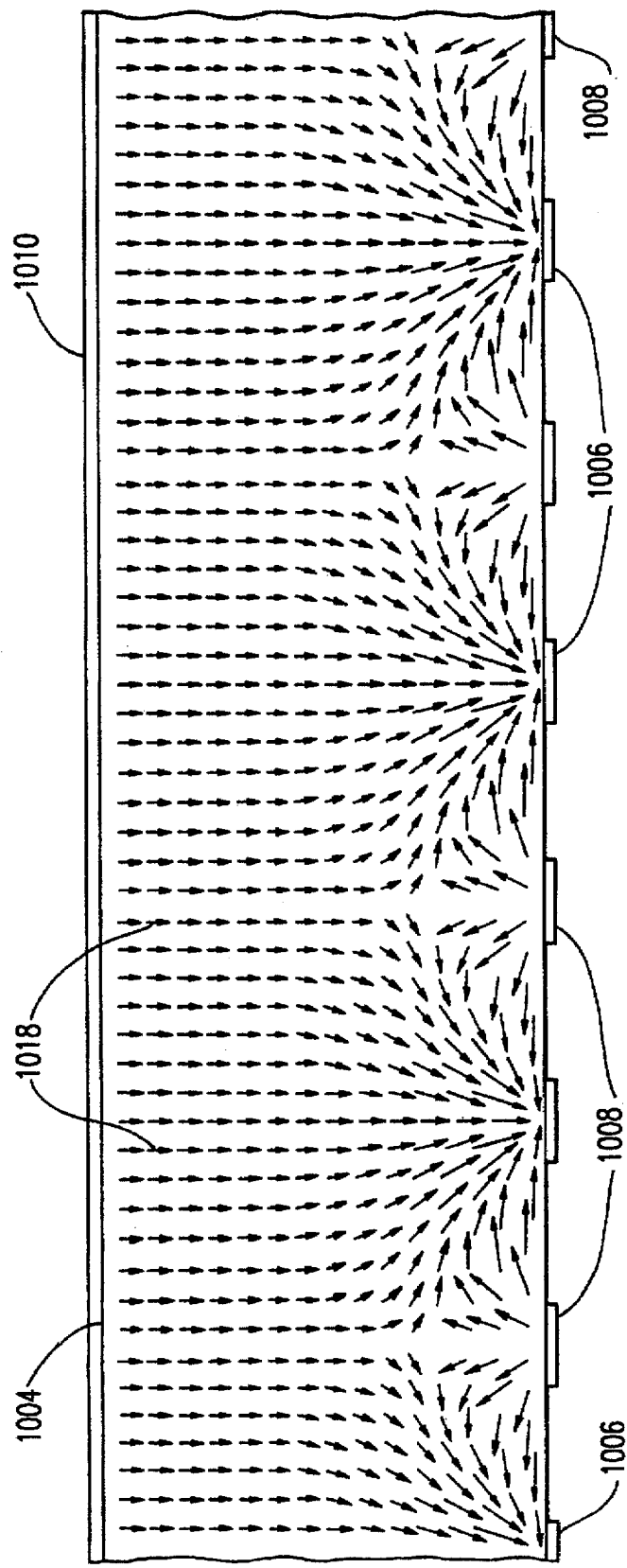
FIG. 10B is a cut-away side view of the array embodiment shown in FIG. 10A taken along line 10B—10B.

FIG. 10 shows an embodiment of a detector array 1000 in accordance with the present invention. FIG. 10A is a perspective view of the detector array 1000. FIG. 10B is a cut-away side view of the detector array 1000 showing the electric field 1018 within the semiconductor crystal 1002.

A cathode 1004 is preferably formed to cover substantially all of the bottom side 1010 of a semiconductor crystal 1002. The cathode 1004 need not fully cover the bottom side 1010 of the crystal 1002, however, and may be nearly any size and shape desired (e.g., a square grid). The semiconductor crystal 1002 is substantially similar to the crystal 502 described above the single-element detector 500 of FIG. 5, with the exception that it may have a larger surface area on the electrode sides 1010, 1012 to accommodate an array of anodes 1006 and a control grid 1008. The crystal 1002 can be formed in a single block of monolithic or tiled semiconductor material.

The detector array 1000 is produced by replacing the single anode with a plurality of anodes 1006 and forming the control electrode 1008 as a grid within which the anodes 1006 are situated on the top side 1012 of the crystal 1002, as shown. Thus, each anode 1006 and its surrounding section of the control grid 1008 forms a pixel. The anodes 1006 and control grid 1008 can be rosined using conventional semiconductor processing techniques. Such pixel arrays are particularly useful for radiation cameras, such as are used in industrial and medical applications.

In addition to the advantages of reducing low-energy tailing and improving resolution and collection efficiency, the detector array structure of the present invention, as illustrated in FIG. 10B, establishes an electric field pattern 1018 that isolates each pixel from its neighbor, thereby suppressing cross-talk. Further, because the anodes 1006 can be made much smaller than the control grid 1008, substantial separation can be achieved between the anodes 1006 and control grid 1008. This has the effect of reducing inter-grid leakage current, which can be a source of unwanted noise in detector array devices.

The detector array 1000 operates under the same principles described above with respect to the various embodiments of the single-element detector. Thus, the control grid 1008 and the anodes 1006 share the charge induced by electron clouds, but, because the control grid 1008 is much larger than the anodes 1006, low-energy tailing is mostly eliminated from the anodes 1006. In addition, the control grid 1008 is preferably set at a voltage level $V_c$ that lies near the voltage level $V_b$ of the cathode 1004. Again, for the detector array 1000, the following voltage relationship exists: $V_c<V_a$. As noted above, this relationship acts to shape the electric field 1018 into field paths that guide the electron clouds toward the anodes 1006. In consequence, the electron clouds induce their full charge on the small anodes 1006. The result is a significant reduction in low-energy tailing for all the anode elements 1006 of the detector array 1000.

Although a single control grid 1008 is shown, zone control grids could be formed to control zones or subsets of the anodes 1006, or a control grid could be formed for each anode.

In one experimental unit fabricated as an array, a plurality of 3 mm×3 mm square pixel detectors were formed by patterning a control grid and centered anodes on a suitable semiconductor crystal (CdZnTe). Such an array is well suited for use in an imager for nuclear medicine.

All or some of the anodes 1006 may be connected together electrically in parallel. As a result, the structure of FIG. 10 can be used to produce single detectors of much larger area than would be possible with a single anode. In addition, such large area detectors have low overall capacitance, allowing the detector 1000 to have high sensitivity proportional to its area or volume and to have high resolution similar to smaller detectors.

IV. Conclusion

An essential feature of the invention is to employ a combination of control electrode(s), anode(s) and cathode(s) in such a way that essentially the full electron charge from a radiation absorption event is collected at the anode, while the effects of hole trapping are shielded from the anode and most low-energy tailing is eliminated from the signal. The electrodes are also configured so as to form an electric field pattern within the crystal that directs electron clouds produced by ionizing radiation efficiently to the anode(s).

A number of embodiments of the present invention have been described. Nevertheless, it will be understood that various modifications may be made without departing from the spirit and scope of the invention. Accordingly, it is to be understood that the invention is not to be limited by the specific illustrated embodiment, but only by the scope of the appended claims.

What is claimed is:

1. A radiation detector, comprising:
   (a) a semiconductor having a plurality of sides and a thickness of at least about 0.5 mm;
   (b) a bias electrode formed on at least one side of the semiconductor;
   (c) a signal electrode formed on at least one side of the semiconductor; and
   (d) at least one control electrode, formed on at least one side of the semiconductor, for directing charge clouds resulting from ionizing events in the semiconductor towards the signal electrode and for substantially reducing the effect on the signal electrode of hole trapping in the semiconductor,
   wherein the radiation detector is capable of detecting energies greater than about 20 KeV.

2. The radiation detector of claim 1 wherein the semiconductor has a Z>34.

3. The radiation detector of claim 1 wherein the semiconductor has a resistivity greater than about $10^7$ ohm-cm.

4. The radiation detector of claim 1 wherein the signal electrode detects an output count rate, the detector including means for applying an actively variable voltage to the control electrode for changing the output count rate.

5. The radiation detector of claim 1 wherein the semiconductor comprises CdTe.

6. The radiation detector of claim 1 wherein the semiconductor comprises CdZnTe.

7. The radiation detector of claim 1 wherein the signal electrode is on the same side of the semiconductor as the control electrode.

8. The radiation detector of claim 1 wherein the signal electrode is on a different side of the semiconductor from the control electrode.

9. The radiation detector of claim 1 wherein the bias electrode is a cathode covering at least a substantial portion of the first side of the semiconductor.

10. The radiation detector of claim 1 wherein the bias electrode is configured to be coupled to a bias voltage source, and wherein the bias electrode is a cathode having a cathode voltage, $V_b$, and $V_b$ is held at a substantially fixed value.

11. The radiation detector of claim 10 wherein the signal electrode is configured to be coupled to a signal electrode voltage source, and wherein the signal electrode has a voltage, $V_a$, and $V_b-V_a$ is dependent on the thickness of the semiconductor.

12. The radiation detector of claim 11 wherein the thickness of the semiconductor is approximately 3 mm and $V_b-V_a$ is approximately −500 Volts.

13. The radiation detector of claim 10 wherein the signal electrode is configured to be coupled to a signal electrode voltage source, and wherein the signal electrode is an anode having an anode voltage, $V_a$, at approximately ground.

14. The radiation detector of claim 10 wherein the control electrode is configured to be coupled to a control electrode voltage source, and wherein the control electrode has a control electrode voltage, $V_c$, and $V_b$ is at approximately ground.

15. The radiation detector of claim 10 wherein the control electrode is configured to be coupled to a control electrode voltage source, and the signal electrode is configured to be coupled to a signal electrode voltage source, and wherein the control electrode has a control electrode voltage, $V_c$, and the signal electrode has a voltage, $V_a$, such that $V_c<V_a$.

16. The radiation detector of claim 10 wherein the control electrode is configured to be coupled to a control electrode voltage source, and the signal electrode is configured to be coupled to a signal electrode voltage source, and wherein the control electrode has a control electrode voltage, $V_c$, and the signal electrode has an anode voltage, $V_a$ and $V_c$ is approximately equal to $(V_a+V_b)/2$.

17. The radiation detector of claim 10 wherein the control electrode is configured to be coupled to a control electrode voltage source, and wherein the control electrode has a control electrode voltage, $V_c$, such that $V_c$ is approximately equal to $V_b$.

18. The radiation detector of claim 17 wherein $V_c=V_b$.

19. The radiation detector of claim 17 wherein the control electrode is connected to the bias electrode.

20. The radiation detector of claim 17 wherein the control electrode is part of the bias electrode.

21. The radiation detector of claim 10 wherein the control electrode is coupled to a first terminal of a capacitor, a second terminal of the capacitor being coupled to ground.

22. The radiation detector of claim 21 wherein the signal electrode is configured to be coupled to a signal electrode voltage source, and wherein the signal electrode is an anode having an anode voltage $V_a$, and wherein a first resistance exists between the bias electrode and the control electrode and a second resistance exists between the control electrode and the signal electrode, whereby the capacitor and the control electrode charge to a voltage level determined by $V_b-V_a$.

23. The radiation detector of claim 1 wherein the control electrode is configured to be coupled to a control electrode voltage source, and wherein the signal electrode is configured to be coupled to a signal electrode voltage source, and wherein the control electrode has a control electrode voltage, $V_c$, and the signal electrode has a voltage, $V_a$, such that $V_c<V_a$.

24. The radiation detector of claim 1 wherein the control electrode is coupled to a constant voltage source.

25. The radiation detector of claim 1 wherein the bias electrode is a cathode having a cathode surface area and the signal electrode has a substantially smaller surface area than the cathode surface area.

26. The radiation detector of claim 25 wherein the signal electrode is an anode located on an opposing surface of the semiconductor from the first side having the cathode.

27. The radiation detector of claim 26 wherein the control electrode is located on the opposing surface and surrounds the anode.

28. The radiation detector of claim 27 wherein the control electrode comprises a substantially circular ring surrounding the anode.

29. The radiation detector of claim 1 wherein the bias electrode, the signal electrode, and the control electrode are formed on the surface of the semiconductor.

30. The radiation detector of claim 29 wherein the bias electrode, the signal electrode, and the control electrode comprise gold film.

31. The radiation detector of claim 1 wherein at least one of the bias electrode, the signal electrode, and the control electrode is buried under the surface of the semiconductor.

32. The radiation detector of claim 1 wherein the signal electrode is segmented into a plurality of segments.

33. The radiation detector of claim 1 wherein the control electrode is segmented into a plurality of segments.

34. The radiation detector of claim 1 wherein the radiation detector includes a plurality of control electrodes.

35. A radiation detector for detecting ionizing radiation, comprising:

(a) a semiconductor responsive to ionizing radiation having a plurality of sides;

(b) a cathode formed on a first side of the semiconductor, the cathode having a cathode surface area and wherein the cathode is coupled to a cathode voltage source, the cathode having a cathode voltage, $V_b$;

(c) an anode formed on a second side of the semiconductor, the second side opposing the first side and having a center, the anode comprising a contact located near the center of the second side and having a substantially smaller surface area than the cathode surface area, wherein the anode is coupled to an anode voltage source, the anode having an anode voltage, $V_a$; and (d) a control electrode formed on the second side of the semiconductor, the control electrode forming a single ring surrounding the anode, wherein the control electrode is coupled to a control voltage source, the control electrode having a control voltage, $V_c$, such that $V_c < V_a$.

36. The radiation detector of claim 35 wherein the semiconductor is formed from CdZnTe.

37. The radiation detector of claim 35 wherein the semiconductor has a thickness and $V_b - V_a$ is dependent on the thickness.

38. The radiation detector of claim 37 wherein the thickness of the semiconductor is approximately 3 mm and $V_b - V_a$ is approximately −400 Volts.

39. The radiation detector of claim 38 wherein $V_a$ is approximately ground and $V_c$ is approximately −300 Volts.

40. The radiation detector of claim 35 wherein the control electrode is coupled to a constant voltage source.

41. The radiation detector of claim 35 wherein the control electrode is coupled to a first terminal of a capacitor, a second terminal of the capacitor being coupled to ground.

42. The radiation detector of claim 41 wherein a first resistance exists between the cathode and the control electrode and a second resistance exists between the control electrode and the signal electrode, whereby the capacitor and the control electrode charge to a voltage level determined by such resistances and $V_b - V_a$.

43. The radiation detector of claim 35 wherein at least one of the cathode, the anode, and the control electrode is formed on the surface of the semiconductor.

44. The radiation detector of claim 43 wherein at least one of the cathode, the anode, and the control electrode comprises gold film.

45. The radiation detector of claim 35 wherein at least one of the cathode, the anode, and the control electrode is buffed under the surface of the semiconductor.

46. The radiation detector of claim 35 wherein the anode and the control electrode are separated on the surface of the semiconductor.

47. The radiation detector of claim 35 wherein the anode and the control electrode are separated by a bulk material on the surface of the semiconductor.

48. The radiation detector of claim 35 wherein the control electrode is a circular ring.

49. The radiation detector of claim 35 wherein the control electrode is a rectangular ring.

50. The radiation detector of claim 35 wherein $V_c = V_b$.

51. The radiation detector of claim 35 wherein the control electrode is connected to the bias electrode.

52. The radiation detector of claim 35 wherein the control electrode is part of the bias electrode.

53. A method for detecting an ionizing radiation emanating from a source using a radiation detector, the radiation detector comprising a semiconductor having a plurality of sides, the semiconductor including a control electrode, a cathode side and an anode side, the cathode side having a cathode and the anode side having an anode, the method comprising the steps of:

(a) placing the radiation detector in a path of the radiation emanating from the source;

(b) generating an electric field internal to the semiconductor via voltages applied on the cathode and anode;

(c) creating an electron charge cloud and an associated hole cloud within the semiconductor by the ionizing radiation;

(d) guiding the electron-charge cloud toward the anode by the electric field;

(e) sharing, between the anode and the control electrode, charge induced by the charge clouds when they are located a relatively significant distance from the anode, such that the charge induced on the anode is very small compared with the charge induced on the control electrode; and (f) decreasing toward zero the induced charge on the control electrode by the electron-charge cloud and increasing the induced charge on the anode to the full value of the electron-charge cloud that arrives at the anode.

54. The method of claim 53 wherein the anode has an anode dimension; and wherein the full value of the electron-charge cloud is induced on the anode when the electron-charge cloud is within a distance away from the anode approximately equal to the anode dimension.

55. The method of claim 53 wherein the electron-charge cloud comprises a plurality of moving electrons; and wherein the step of guiding the electron-charge cloud further includes the steps of:

(a) forming a plurality of guide paths by the electric field, each guide path having a beginning and an end, the plurality of guide paths being substantially parallel to one another at the beginnings and turning toward the anode near the ends; and (b) guiding each of the plurality of moving electrons along a corresponding guide path toward the anode.

56. The method of claim 55 wherein the control electrode is connected to the bias electrode.

57. The method of claim 55 wherein the control electrode is part of the bias electrode.

58. The method of claim 53, further comprising the steps of:

(a) biasing the control electrode to a control voltage, $V_c$;

(b) biasing the anode to an anode voltage, $V_a$;

(c) biasing the cathode to a cathode voltage, $V_b$; and (d) maintaining $V_c$ at a voltage level less than $V_a$.

59. The method of claim 58 comprising the step of biasing the cathode and the control detector so that $V_c = V_b$.

60. The method of claim 53, further comprising the step of forming the control electrode such that it surrounds the anode.

61. The method of claim 53, further comprising the steps of:

(a) coupling the control electrode to a capacitor; and (b) coupling the capacitor to ground.

62. The method of claim 61, further comprising the steps of:

(a) biasing the cathode to a cathode voltage, $V_b$;

(b) biasing the anode to an anode voltage, $V_a$; and (c) charging the capacitor and the control electrode to a voltage determined in accordance with $V_b-V_a$.

63. The method of claim 53 wherein the semiconductor includes a plurality of movable electrons, the electron-charge cloud comprising at least some of the plurality of movable electrons.

64. The method of claim 53, further comprising the step of segmenting the anode into a plurality of segments.

65. The method of claim 53, further comprising the step of segmenting the control electrode into a plurality of segments.

66. A system for detecting an ionizing radiation, comprising:

(a) a radiation detector, including:

(1) a semiconductor having a plurality of sides, (2) a cathode formed on a cathode side of the semiconductor, (3) an anode formed on at least one side of the semiconductor different from the cathode side, (4) a control electrode formed on at least one side of the semiconductor different from the cathode side; and (b) means for forming an electric field internal to the semiconductor;

wherein, when the ionizing radiation is absorbed in the radiation detector, a movable charge cloud is generated within the semiconductor as a result of the ionizing radiation;

wherein the electric field guides the electron-charge cloud toward the anode; wherein the anode and the control electrode share a charge induced by the charge cloud when the charge cloud is located a relatively significant distance away from the anode, such that the charge on the anode is small; and wherein the charge induced by the electron-charge cloud on the anode increases as the electron-charge cloud becomes close to the anode.

67. The system of claim 66 wherein the anode has an anode dimension; and wherein the means for forming the electric field, the control electrode, and the anode are configured so that the charge is completely induced on the anode when the electron-charge cloud arrives at the anode, most of which occurs within a distance away from the anode approximately equal to the anode dimension.

68. The system of claim 66 wherein the electron-charge cloud comprises a plurality of movable electrons; and wherein the anode for forming the electric field is configured so that a plurality of guide paths are formed by the electric field, each guide path having a beginning and an end, the plurality of guide paths being substantially parallel to one another at the beginnings and turning toward the anode near the ends; and wherein each of the plurality of movable electrons is guided along a corresponding guide path toward the anode.

69. The system of claim 66 wherein the control electrode is formed such that it surrounds the anode.

70. The system of claim 66 wherein the means for forming the electric field includes a capacitor coupled to the control electrode and to ground.

71. The system of claim 70 wherein the anode has a voltage $V_a$, wherein the cathode is biased to a cathode voltage, $V_b$; and wherein the capacitor and the control electrode are charged to a voltage determined in accordance with $V_b-V_a$.

72. The system of claim 71 wherein the control electrode has a voltage $V_c$ and wherein $V_c=V_b$.

73. The system of claim 66 wherein the control electrode is connected to the cathode.

74. The system of claim 66 wherein the control electrode is part of the cathode.

75. An apparatus for detecting ionizing radiation, comprising:

(a) a semiconductor having at least three electrodes, including a cathode, an anode, and a control electrode, and a means for biasing each electrode to a voltage potential, wherein an electric field is created within the semiconductor;

wherein, as the ionizing radiation is absorbed in the semiconductor, a charge cloud is generated within the semiconductor;

wherein the charge cloud induces a charge in the semiconductor, the charge being shared by the anode and the control electrode until the charge has a close proximity to the anode.

76. The apparatus of claim 75 wherein the voltage potential of the control electrode is less than the voltage potential of the anode.

77. The apparatus of claim 75 wherein the semiconductor is formed from a CdZnTe material.

78. The apparatus of claim 75 wherein the control electrode and anode are formed on a same side of the semiconductor, the control electrode forming a ring around the anode.

79. The apparatus of claim 75, further comprising a capacitor coupled to the control electrode and to ground.

80. The apparatus of claim 75 wherein the anode is formed on a side of the semiconductor; and wherein the electric field has a plurality of electric field lines, the lines being substantially parallel to one another and substantially orthogonal to the side on which the anode is formed and converging toward the anode as the lines approach the side on which the anode is formed.

81. The apparatus of claim 80 wherein the electric field lines are configured to guide the charge cloud toward the anode.

82. The apparatus of claim 75 wherein the anode has an anode dimension; and wherein the three electrodes are configured so that the control electrode has only a negligible share of the charge when the charge cloud is within a distance away from the anode substantially equivalent to the anode dimension.

83. The apparatus of claim 82 wherein the three electrodes are configured so that the anode has only a small share of the charge when the charge cloud is beyond the distance away from the anode.

84. The apparatus of claim 75 wherein the semiconductor includes a plurality of electrons movable within the semiconductor; and wherein the three electrodes are configured so that the charge cloud comprises at least some of the movable electrons.

85. The system of claim 75 wherein the control electrode is biased to the same voltage potential as the cathode.

86. The system of claim 75 wherein the control electrode is connected to the cathode electrode.

87. The system of claim 75 wherein the control electrode is part of the bias electrode.

88. An apparatus for detecting ionizing radiation, comprising a semiconductor having a thickness of at least about 0.5 mm and having at least three electrodes, including a cathode, an anode, and a control electrode, the ionizing radiation creating a charge cloud within the semiconductor, the electrodes being formed on the semiconductor and means for biasing the electrodes to generate an electric field pattern within the semiconductor such that the electric field pattern focuses the charge cloud resulting from the ionizing radiation towards the anode, thereby substantially reducing the effect of hole trapping in the semiconductor on the anode, wherein the radiation detector is capable of detecting energies greater than about 20 KeV.

89. The apparatus of claim 88 wherein the control electrode is biased to a voltage level less than the voltage level to which the anode is biased.

90. The apparatus of claim 88 wherein the semiconductor has a plurality of sides, the control electrode and the anode being formed on a side of the semiconductor opposing a side on which the cathode is formed, the control electrode surrounding the anode.

91. The apparatus of claim 88 wherein the anode comprises a contact point.

92. The apparatus of claim 88 wherein the control electrode is coupled to a capacitor, the capacitor being coupled to ground, the control electrode and the capacitor being charged to a voltage level determined by voltage levels of the anode and the cathode.

93. The apparatus of claim 88 wherein the control electrode is biased to a voltage equal to the voltage to which the cathode is biased.

94. The apparatus of claim 88 wherein the control electrode is connected to the cathode.

95. The apparatus of claim 88 wherein the control electrode is part of the cathode.

96. A radiation detector array, comprising:

(a) a semiconductor having a plurality of sides and a thickness of at least about 0.5 mm;

(b) a cathode formed on at least one side of the semiconductor;

(c) an array of anodes formed on at least one side of the semiconductor; and (d) a control electrode pattern, formed on at least one side of the semiconductor, for directing charge clouds resulting from ionizing events in the semiconductor toward a respective anode and for substantially reducing the effect on the array of anodes of hole trapping in the semiconductor, the control electrode pattern being formed such that it affects each of the anodes in the array of anodes, wherein the radiation detector is capable of detecting energies greater than about 20 KeV.

97. The radiation detector of claim 96 wherein the control electrode pattern comprises a grid pattern.

98. The radiation detector of claim 96 wherein each of the anodes is surrounded by a corresponding section of the control electrode pattern; and wherein each of the anodes and the corresponding section comprise a pixel.

99. The radiation detector of claim 96 wherein at least some of the anodes in the array of anodes are electrically coupled together.

100. The radiation detector of claim 96 wherein the control electrode has a voltage $V_c$, and the cathode electrode has a voltage $V_b$, and wherein $V_c=V_b$.

101. The radiation detector of claim 96 wherein the control electrode is connected to the cathode.

102. The radiation detector of claim 96 wherein the control electrode is part of the cathode.

* * * * *